(12) United States Patent
Hirooka

(10) Patent No.: US 8,810,722 B2
(45) Date of Patent: Aug. 19, 2014

(54) CAMERA MODULE LENS HOLDER

(75) Inventor: Shohgo Hirooka, Osaka (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 280 days.

(21) Appl. No.: 13/416,918

(22) Filed: Mar. 9, 2012
(Under 37 CFR 1.47)

(65) Prior Publication Data

US 2012/0230670 A1    Sep. 13, 2012

(30) Foreign Application Priority Data

Mar. 11, 2011   (JP) ................. 2011-054806

(51) Int. Cl.
*H04N 5/225* (2006.01)

(52) U.S. Cl.
USPC .......................................... 348/374; 348/335

(58) Field of Classification Search
USPC .................. 348/335, 360, 373, 374
See application file for complete search history.

(56) References Cited

U.S. PATENT DOCUMENTS

| | | | |
|---|---|---|---|
| 7,528,884 B2 * | 5/2009 | Minamio et al. | 348/373 |
| 2007/0047109 A1 | 3/2007 | Shibata et al. | |
| 2009/0230493 A1 * | 9/2009 | Watanabe et al. | 257/433 |
| 2010/0141825 A1 | 6/2010 | Kim et al. | |
| 2010/0149410 A1 * | 6/2010 | Matsuzawa | 348/374 |
| 2011/0063496 A1 * | 3/2011 | Chang | 348/360 |

FOREIGN PATENT DOCUMENTS

| | | |
|---|---|---|
| JP | 2002-303773 A | 10/2002 |
| JP | 2005-292242 A | 10/2005 |
| JP | 2005-347397 A | 12/2005 |
| JP | 2007-067978 A | 3/2007 |
| JP | 2007-259064 A | 10/2007 |
| JP | 2008-172743 A | 7/2008 |
| JP | 2009-003058 A | 1/2009 |
| JP | 2010-141123 A | 6/2010 |

* cited by examiner

*Primary Examiner* — Gevell Selby
(74) *Attorney, Agent, or Firm* — Edwards Wildman Palmer LLP; David G. Conlin; David J. Silvia

(57) ABSTRACT

A camera module is configured such that a lens holder includes (i) an abutting section for abutting the glass substrate in order to determine a position of the glass substrate, and (ii) a protrusion section configured to be bonded with the glass substrate via an adhesive agent, and the abutting section is not bonded with the glass substrate; and the protrusion section has a top portion that is positioned apart from the glass substrate.

12 Claims, 26 Drawing Sheets

FIG. 14
(a)
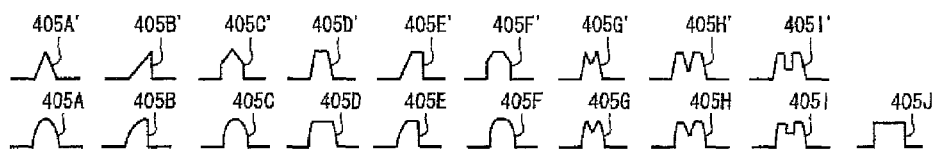
(b)
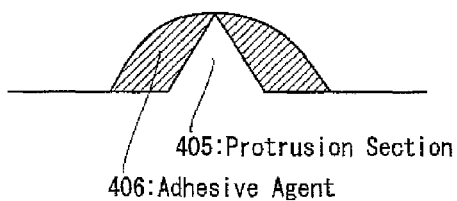
405: Protrusion Section
406: Adhesive Agent
(c)
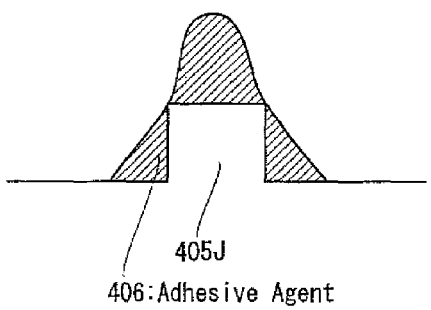
405J
406: Adhesive Agent FIG. 17
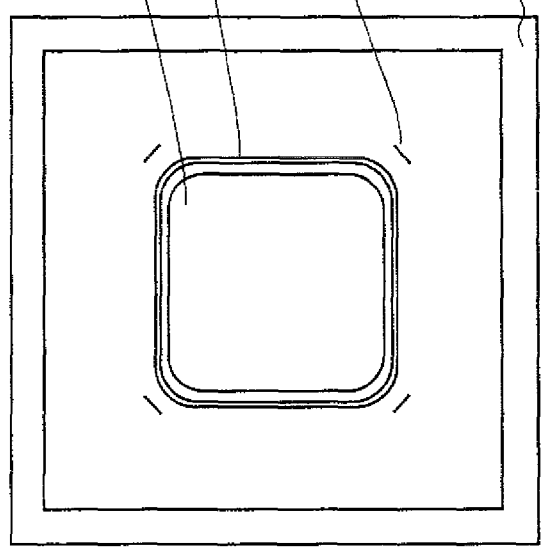
(a) 410: Opening Section
404: Abutting Section
405: Protrusion Section
402: Lens Holder
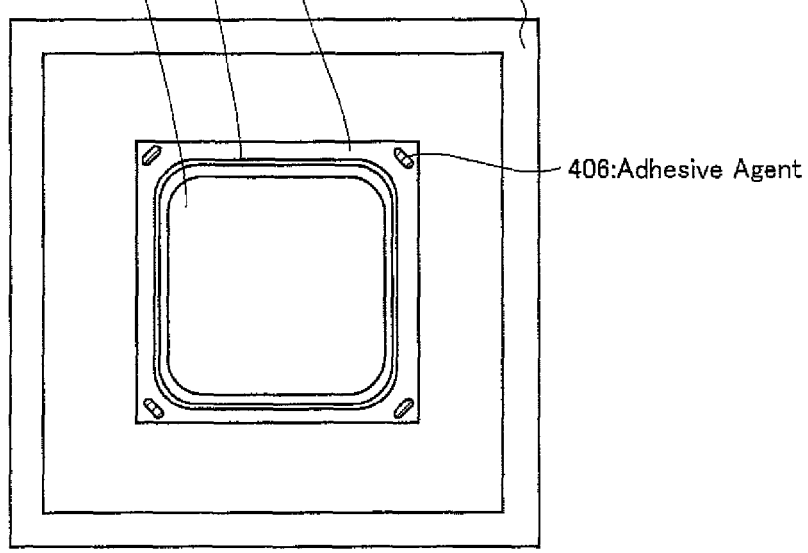
(b) 410: Opening Section
404: Abutting Section
403: Glass Substrate
402: Lens Holder
406: Adhesive Agent FIG. 18
(a)
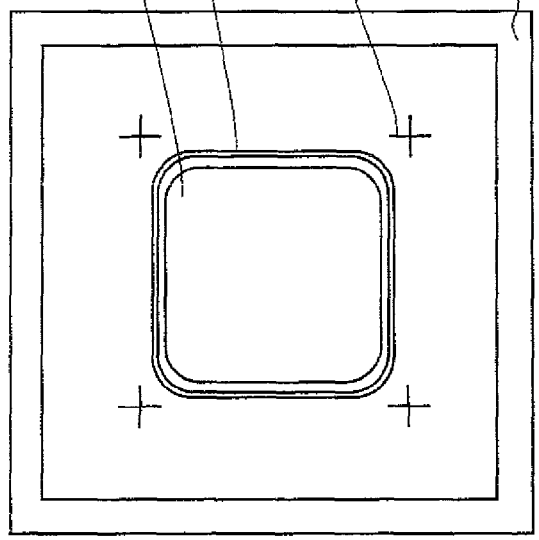
410: Opening Section
404: Abutting Section
405: Protrusion Section
402: Lens Holder
(b)
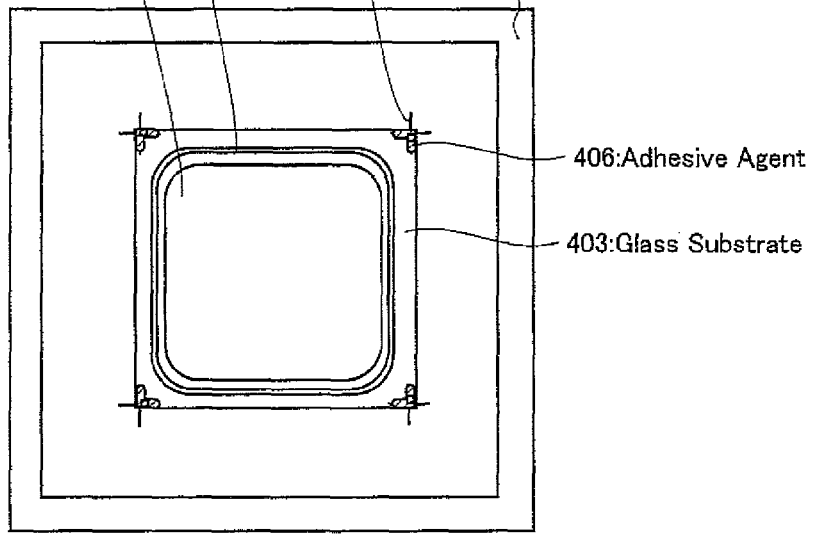
410: Opening Section
404: Abutting Section
405: Protrusion Section
402: Lens Holder
406: Adhesive Agent
403: Glass Substrate

CAMERA MODULE LENS HOLDER

This Nonprovisional application claims priority under 35 U.S.C. §119(a) on Patent Application No. 2011-054806 filed in Japan on Mar. 11, 2011, the entire contents of which are hereby incorporated by reference.

TECHNICAL FIELD

The present invention relates to a camera module to be mounted on camera-equipped portable phones, digital still cameras, security cameras, etc., so as to perform image capturing, and a production method of the camera module.

BACKGROUND ART

A camera module mounted on a portable phone or the like has a structure including (i) a solid-state image sensor, (ii) a glass substrate, (iii) a wired board with terminals, (iv) a lens, and (v) a holder (lens holder) for holding the lens. The solid-state image sensor is, for example, CCD (Charge Coupled Device) or CMOS (Complementary Metal Oxide Semiconductor) image sensor.

Recently, the solid-state image sensor has been further miniaturized. Thus, if there is a foreign material present in a light receiving portion of the solid-state image sensor, in an optical path in which light to enter the solid-state image sensor travels on the glass substrate, or in the like position, shadow of the foreign material would be possibly captured on a screen on which a captured image is displayed. On the screen, the shadow of the foreign material appears as a black spot, or stain, thereby causing defection in the image captured by the camera module. In the following, such a foreign material is referred to as "dust". Furthermore, if the dust is of such a minute size that it has a size of 30 μm or less, or about 20 μm, the dust not only causes the shadow or black spot on the screen, but also is difficult to remove from the camera module because the dust can enter gaps formed in non-flat portions in a micro lens arrays.

Here, the dust contaminating the inside the camera module can be classified generally into two types: process-origin dust; and material-origin dust.

Examples of the process-origin dust encompass ones generated by wearing of devices used in a manufacturing process of the camera module, ones (hair and the like) derived from a body of a worker in the manufacturing process, and the like dust. The material-origin dust is relatively large (to be visible by human eyes) and is easy to find and remove by inspections or the like.

Examples of the material-origin dust encompass (i) ones carried by components of the camera module when the components are shipped in, (ii) exfoliation (such as filler) fallen off from a molded resin or an adhesive agent, (iii) dust worn off from an auto focusing or zooming operating mechanism or component during its operation, and (iv) the like. The material origin dust often very small in size, because it would be minute resin pieces, a fallen-off filler, or the like.

If dust of a visible size is present on the glass substrate, it is easy to remove the dust from the glass substrate. However, if minute dust is attached to a wall surface of the lens holder, a surface of the wiring board, etc. other than the light receiving portion (micro lens array) of the solid-state image sensor, it is difficult to detect the dust by inspection or the like. Failure of detecting the dust would lead to shipping out a defective camera module having a risk of causing defective image capturing. If the dust is moved to the light receiving portion (micro lens array) of the solid-state image sensor by vibration and/or impact during transportation or delivery, the camera module is impaired at a dealer or a user.

The glass substrate is not only a component having optical functions such as a function as an optical filter as described above, but also a component for preventing dust from contaminating the light receiving portion (micro lens array) of the solid-state image sensor, the wall surface of the lens holder, the surface of the wired board, etc.

Patent Literatures 1 to 3 discloses techniques as to assembling structures that such a glass substrate has for the purpose of preventing the dust contamination.

The object of the technique disclosed in Patent Literature 1 is to accurately determine a distance between an optical system of an image capturing device 1b and an image capturing surface 211, and a tilting of the optical system with respect to the image capturing surface 211. In order to attain the object, the Patent Literature 1 discloses the following technical feature. From above an electrically conductive adhesive agent (such as silver paste) applied on an electrode on a steric circuit substrate 3, a glass substrate 22 is pressed against the steric circuit substrate 3 via a ball bump 221b. By deforming the ball bump 221b by a force of the pressing, the glass substrate 22 is adhered to a mounding reference surface 351 in such a state that the glass substrate 22 is abutted against the mounting reference surface 351, which is a top edge of a protrusion section 35b (see FIG. 25).

The technique disclosed in Patent Literature 1, an image capturing device 21 is mounted on the steric circuit substrate 3 with the highly-flat glass substrate 22 imposed therebetween. This makes it possible to mount the image capturing device 21 on the steric circuit substrate 3 easily and accurately. Furthermore, the glass substrate 22 has a thermal expansion coefficient (about $8 \times 10^{-6}/°$ C.) smaller than that (about $25 \times 10^{-6}/°$ C.) of a resin substrate. This reduces a heat stress applied on a position (connection portion) at which the image capturing device 21 and the glass substrate 22 are connected with each other, thereby giving a better connection reliability to the image capturing device 21.

Patent Literature 2 discloses the following technical feature. On an upper surface of a ring-shaped connection section 34 of a frame-shaped member 30, a thermally-curing adhesive agent 40 (illustrated by hatching with oblique lines) is applied. The adhesive agent 40 is applied selectively on a region other than a groove region B, which is that part of the upper surface of the ring-shaped connection section in which grooves 36 are provided (see FIG. 26).

Patent Literature 3 discloses the following technical feature. A camera module has a pedestal portion having an abutting section positioned apart from side walls, and connection sections positioned at corners between adjacent side walls, and a bank section. The abutting section is not for bonding with a glass cover but is for abutting against the glass cover so as to determine position of the glass cover with respect to a mounding surface of the pedestal portion, and to determine a tilting angle of the glass cover. The abutting section and the bank section further have a function of banking up an adhesive agent to prevent the adhesive agent from flooding into an image capturing region. By this, a good image capturing quality is ensured meanwhile a wide-spreading of a connection region is prevented. Like the abutting section, the bank section also abuts against the glass cover in bonding the pedestal portion and the glass cover with each other. Meanwhile, the connection section is lower than the abutting section, so that the connection section will not touch the glass cover in bonding the pedestal portion and the glass cover with each other. Thus, the bonding the pedestal portion and the glass cover with each other crease a gap between the connection section and the glass cover. The bonding between the connection section and the glass cover is carried out in the gap.

CITATION LIST

Patent Literatures

Patent Literature 1
Japanese Patent Application Publication, Tokukai, No. 2005-292242 A (published on Oct. 20, 2005)
Patent Literature 2
Japanese Patent Application Publication, Tokukai, No. 2010-141123 A (published on Jun. 24, 2010)
Patent Literature 3
Japanese Patent Application Publication, Tokukai, No. 2009-3058 A (published on Jan. 8, 2009)

SUMMARY OF INVENTION

Technical Problem

The technique disclosed in Patent Literature 1 requires that the bonding between the steric circuit substrate 3 and the glass substrate 22 need providing, therebetween, the ball bump 221b higher than the mounting reference surface 351, and deforming the ball bump 221b by pressing. If the force of the pressing is not strong enough, the deformation of the ball bump 221b becomes insufficient. This causes the glass substrate 22 to abut against the mounding reference surface 351 insufficiently, thereby creating a risk that the distance between the steric circuit substrate 3 and the glass substrate 22, and the tilting angle of the glass substrate are deviated from desired distance and tilting angle, respectively. This also causes insufficient abutting of the ball bump 221b against the steric circuit substrate, thereby creating a risk that electric conduction between the ball bump 221b and the steric circuit substrate 3 becomes defective. On the contrary, if the force of the pressing is excessively strong, the glass substrate 22 will strongly press the mounting reference surface 351, thereby creating a risk that the mounting reference surface 351 is deformed and/or the glass substrate 22 is broken. Further, the deformation of the mounting reference surface 351 would create a risk that the distance between the steric circuit substrate 3 and the glass substrate 22, and the tilting angle of the glass substrate are deviated from desired distance and tilting angle, respectively.

Moreover, the technique disclosed in Patent Literature 1 is such that the glass substrate 22 has a thermal expansion coefficient (about $8 \times 10^{-6}/°C.$) much smaller than that (about $25 \times 10^{-6}/°C.$) of the steric circuit substrate 3, which is a resin substrate. As a result, if thermal expansion occurs in the glass substrate 22 and the steric circuit substrate 3 bonded together, the steric circuit substrate 3 is extended further than the glass substrate, thereby applying a stress on the connection portion or the glass substrate 22. Moreover, because the ball bump 221b and the steric circuit substrate 3 are bonded tightly, it is difficult to buffer the stress at the connection portion at which the bonding bump 221b and the steric circuit substrate 3 are bonded. Consequently, the stress would be a cause of peeling or breaking of the glass substrate 22.

The technique disclosed in Patent Literature 2 does not perform the determination of the position and tilting of the glass cap 50 with respect to the frame-shaped component 30.

Moreover, the technique disclosed in Patent Literature has the following drawback. If the frame-shaped component 30 and the glass cap 50 are connected via their contact surfaces which are too flat, a gap between their surfaces will be too narrow to bent out swelling air. On the other hand, if the frame-shaped component 30 and the glass cap 50 are connected via their contact surfaces, at least one of which is not flat, bending out the swelling air can be performed but the gap become so wide to face the risk that foreign materials enter into the gap.

In addition, if the frame-shaped component 30 and the glass cap 50 are connected via contact surfaces of a large contact (bonding) area, the contact surfaces cannot maintain desired smoothness necessary for performing the bonding highly accurately. That is, it is necessary to have a small bonding area between the contact surfaces of the frame-shaped component 30 and the glass cap 50. Furthermore, downsizing of portable devices such as portable phones etc. requires that a region to which the adhesive agent is to be applied should be limited even within a region in which components to be bonded overlap each other in assembling the camera module.

Conventionally, in order to bond a glass substrate (glass cap 50) to a lens holder (frame-shaped component 30), an adhesive agent is applied on a flat surface of the lens holder (frame-shaped component 30) by using a dispenser (applying device). However, the dispenser has a difficulty in dispensing the adhesive agent in a constant direction under influence of various forces applied on the dispenser according to (i) a speed at which the adhesive agent is pushed out from the dispenser and (ii) a moving speed etc. of the dispenser. As a result, it is difficult to apply the adhesive agent straightly (in a non-staggered manner), and the adhesive agent is applied in a staggered manner to have a staggered trace.

In the technique disclosed in Patent Literature 2, it is necessary to spare a region to allow the adhesive agent to be applied with the staggered trace and a region to allow the adhesive agent to be extended in bonding. This inhibits downsizing of the camera module. In the technique disclosed in Patent Literature 1, the adhesive agent is applied pointedly to points at which the ball bump 221b and the steric circuit substrate 3 are to be bonded. Thus, the technique disclosed in Patent Literature 1 does not relate to the aforementioned drawback regarding the downsizing of the camera module.

In the technique disclosed in Patent Literature 3, the abutting section functions to bank up the adhesive agent in bonding the connection sections and the glass cover, thereby preventing the connection region from being widely spread. The abutting section according to Patent Literature 3 prevents the wide-spreading of the connection region by causing the adhesive agent to attach to the abutting section.

When the adhesive agent is attached to the abutting section in bonding the connection section and the cover glass, there is a risk that the abutting section is bonded to the cover glass. In case where the abutting section is bonded to the glass cover, the abutting section is fixedly bonded to the glass cover, thereby causing the glass cover to be firmly fixed.

In the technique disclosed in Patent Literature 3, the firm fixing of the glass cover by the abutting section makes it difficult to absorb the stress caused due to the thermal expansion of the pedestal section and/or the glass cover and applied on the glass cover or the bonding portion at which the pedestal section and the glass cover is bonded. The stress would possibly damage the glass cover.

Moreover, the technique disclosed in Patent Literature 3 is such that the gap between the abutting section and the glass cover in bonding the connection section and the glass cover is smaller than a diameter of a filler and a curing agent contained in the adhesive agent, but the adhesive agent can enter the gap. Thus, the gap at which the abutting section and the glass cover abut causes only a main component of the adhesive agent to enter and spread therein. In the technique disclosed in Patent Literature 3, this results in quality deterioration of the adhesive agent or causes post-bonding curing to be insufficient in some parts. This leads to a risk of lowering accuracy of bonding of the pedestal section and the glass cover.

Moreover, the technique disclosed in Patent Literature 3 is such that the connection sections are provided at the corners of adjacent side walls, and the adhesive agent is provided in the gap on the top of the connection sections. Moreover, in the technique disclosed in Patent Literature 3, the glass cover abuts the side walls. Glass processing (dicing etc.) is generally carried out at most with accuracy needing allowance of about +/−0.05 mm. Moreover, in general, it is necessary to have a gap (clearance) between the glass cover and the side wall in order to absorb the allowance. Thus, there is a slight gap between the glass cover and the side wall. There is a risk that the adhesive agent may enter into the gap, thereby being extended, along a reverse side of the glass cover, out of the region in which the adhesive agent supposed to remain for bonding. This leads to a risk that the bonding between the connection section and the glass cover becomes insufficient in the technique disclosed in Patent Literature 3.

The present invention was accomplished in view of the aforementioned problem, and one object of the present invention is to provide a camera module a camera module and a production method thereof, each of which makes it possible to perform bonding of a glass substrate to a lens holder in such a way to achieve (i) high accuracy in bonding and glass substrate positioning, (ii) reduction in damaging the glass substrate, and (iii) miniaturization.

Solution to Problem

In order to attain the object, a camera module according to the present invention is a camera module including a lens holder for holding a lens, and a glass substrate bonded to the lens holder, wherein: the lens holder includes (i) an abutting section for abutting the glass substrate in order to determine a position of the glass substrate, and (ii) a protrusion section configured to be bonded with the glass substrate via an adhesive agent; the abutting section is not bonded with the glass substrate; and the protrusion section has a top portion that is positioned apart from the glass substrate.

With this configuration, the position of the glass substrate can be determined by abutting the glass substrate to the abutting section. Therefore, it is possible to perform the positioning of the glass substrate in bonding the glass substrate to the lens holder.

With this configuration, it is not necessary that the lens holder or the glass substrate should have a component higher than the abutting section in order to perform the bonding of the glass substrate to the lens holder. That the camera module according to the present invention does not need pressing the lens holder or the glass substrate in abutting the glass substrate to the abutting section. Therefore, it is possible to reduce the risk that the distance between the lens holder and the glass substrate, and the tilting angle of the glass substrate are deviated from the desired distance or tilting angle. Moreover, it is possible to reduce the factor for causing disconnection in the glass substrate.

According to the arrangement, the abutting section, which is a portion with which the lens holder abuts the glass substrate, is not bonded to the glass substrate, meanwhile the protrusion section, lower than the abutting section, is bonded to the glass substrate. This makes it possible that the glass substrate and the protrusion section do not touch each other when the glass substrate abuts the abutting section. This allows the adhesive agent to interpose between the glass substrate and the protrusion section. Unless the adhesive agent is not an adhesive agent having a very large adhesive strength (very small flexibility), the behavior of the adhesive agent can absorb the stress caused by the thermal expansion/shrinkage of the lens holder and/or the glass substrate. Thus, the camera module can reduce the peeling or cracking of the glass substrate.

With this configuration, the adhesive agent, applied to the top portion of the protrusion section by an applying device such as the dispenser or the like, abuts the top portion of the protrusion section, and the adhesive agent as abutted thereto adheres to the top portion of the protrusion section. Therefore, the adhesive agent can be applied in a non-staggered manner by abutting the protrusion section at the top portion thereof, even if the adhesive agent is not ejected in a constant direction from the applying device. As described above, the protrusion section has a guiding function for applying the adhesive agent on the lens holder in a non-staggered manner. Thus, the camera module does not need a space for allowing to apply the adhesive agent with the staggered trace. This makes it possible to downsize the camera module.

In this Description, what is meant by the term "top portion" is an upper edge portion of a given member, and the upper edge portion may be a point, a line, or a surface.

With this configuration, the camera module is configured such that the glass substrate will not be bonded with the abutting section. Thus, the adhesive agent will not flow to the region where the glass substrate abuts the abutting section. Therefore, it will not happen that only the main component of the adhesive agent is spread, by wetting, to the region where the glass substrate abuts the abutting section. This makes it possible to reduce the risk that a portion at which curing of the adhesive agent is insufficient or the accuracy in the bonding of the lens holder and the glass substrate is reduced.

Furthermore, this configuration, which makes it possible to apply the adhesive agent in a non-staggered manner by the function of the protrusion section, allows to reduce the region to which the adhesive agent is applied. This reduces the risk that the adhesive agent flows into the gap between the glass substrate and the side wall of the lens holder. This makes it possible to suppress the risk that the bonding between the lens holder and the glass substrate is insufficient.

In order to attain the object, a production method according to the present invention is a production method for producing a camera module including a lens holder for holding a lens, and a glass substrate bonded to the lens holder, wherein the lens holder includes (i) an abutting section for abutting the glass substrate in order to determine a position of the glass substrate, and (ii) a protrusion section configured to be bonded with the glass substrate via an adhesive agent, the abutting section is not bonded with the glass substrate; and the protrusion section has a top portion that is positioned apart from the glass substrate, the method comprising: applying the adhesive agent on the protrusion section, so that a top portion of the adhesive agent applied on the protrusion section protrudes beyond a top portion of the abutting section in height level; and abutting the glass substrate to the abutting section, so as to bond the glass substrate and the protrusion section together via the adhesive agent.

In order to attain the object, a production method according to the present invention is a production method for producing a camera module including a lens holder for holding a lens, and a glass substrate bonded to the lens holder, wherein the lens holder includes (i) an abutting section for abutting the glass substrate in order to determine a position of the glass substrate, and (ii) a protrusion section configured to be bonded with the glass substrate via an adhesive agent, the abutting section is not bonded with the glass substrate; and the protrusion section has a top portion that is positioned apart from the glass substrate, the method comprising: applying the adhesive agent on the protrusion section, so that a height of the adhesive agent applied on the protrusion section is greater than a level difference between the abutting section and the protrusion section; and abutting the glass substrate to the abutting section, so as to bond the glass substrate and the protrusion section together via the adhesive agent.

In order to attain the object, a production method according to the present invention is a production method for producing a camera module including a lens holder for holding a lens, and a glass substrate bonded to the lens holder, wherein the lens holder includes (i) an abutting section for abutting the glass substrate in order to determine a position of the glass substrate, and (ii) a protrusion section configured to be bonded with the glass substrate via an adhesive agent, the abutting section is not bonded with the glass substrate; and the protrusion section has a top portion that is positioned apart from the glass substrate, the method comprising: abutting the glass substrate to the abutting section; and applying the adhesive agent to a gap between the protrusion section and the glass section abutted to the abutting section.

Each of these methods makes it possible to realize the bonding structure of the camera module according to the present invention for bonding the lens holder and glass substrate Advantageous Effects of Invention As described above the present invention is arranged such that a camera module includes a lens holder for holding a lens, and a glass substrate bonded to the lens holder, wherein: the lens holder includes (i) an abutting section for abutting the glass substrate in order to determine a position of the glass substrate, and (ii) a protrusion section configured to be bonded with the glass substrate via an adhesive agent; the abutting section is not bonded with the glass substrate; and the protrusion section has a top portion that is positioned apart from the glass substrate.

Thus, the present invention makes it possible to perform highly accurately the bonding and positioning of the glass substrate in bonding the glass substrate to the lens holder, to prevent the glass substrate from being damaged, and to down size the camera module.

BRIEF DESCRIPTION OF DRAWINGS

FIG. 14
(a) of FIG. 14 is a cross sectional view illustrating one example of a shape of the protrusion section. (b) of FIG. 14 is a cross sectional view illustrating behavior of the adhesive agent in case where the protrusion section has a sharp top section. (c) of FIG. 14 is a cross sectional section illustrating behavior of the adhesive agent in case where the protrusion section has a flat top section.
FIG. 18
(a) and (b) of FIG. 18 are plan views illustrating still another embodiments regarding the region in which the protrusion section is provided.

FIG. 19 is a plan view illustrating one embodiment in which the abutting section has an air releasing groove.

Figure 20:
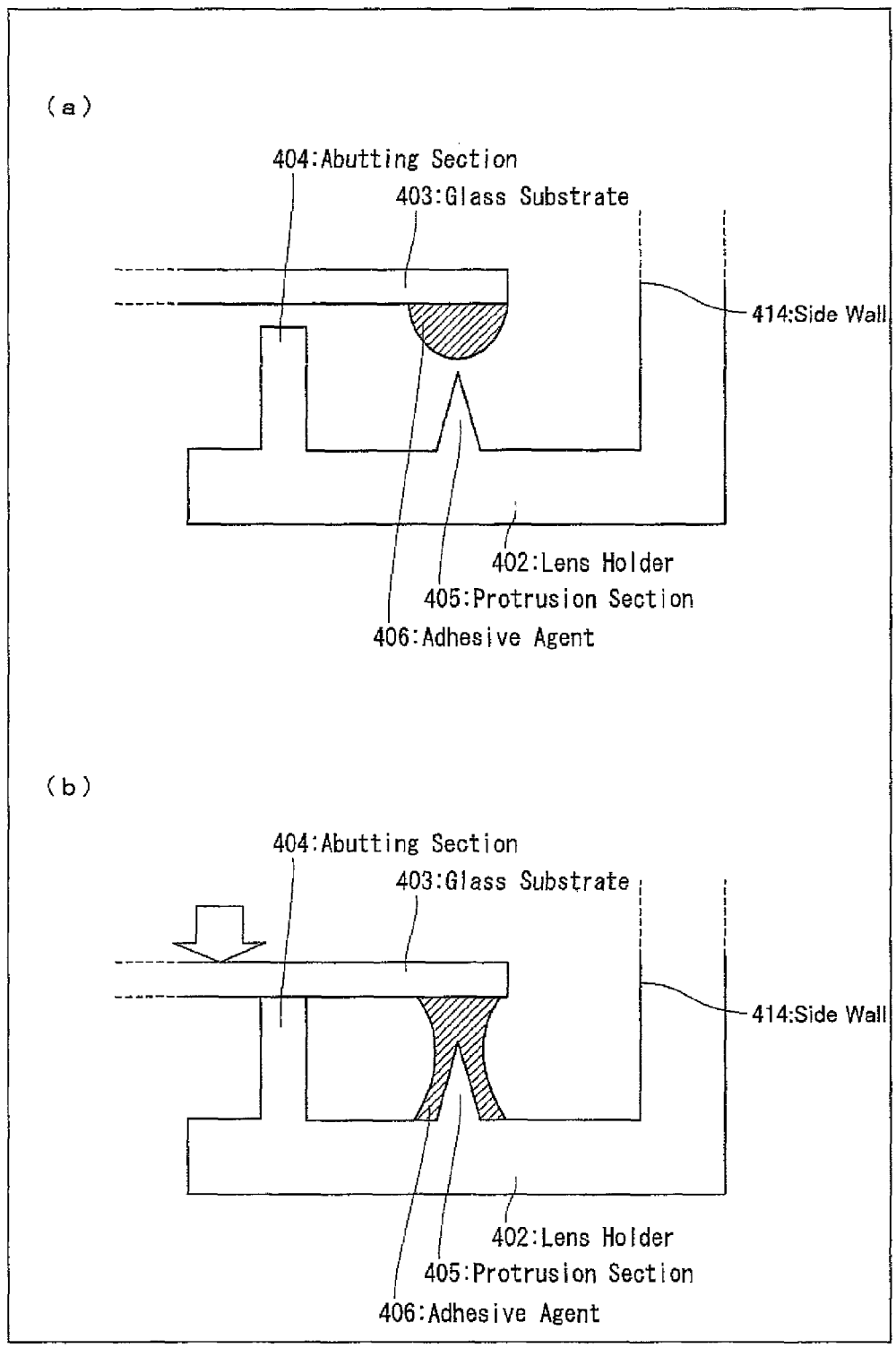
FIG. 20

(a) and (b) of FIG. 20 are cross sectional view illustrating how the glass substrate is bonded to the lens holder in another way.

FIG. 21

Figure 21:
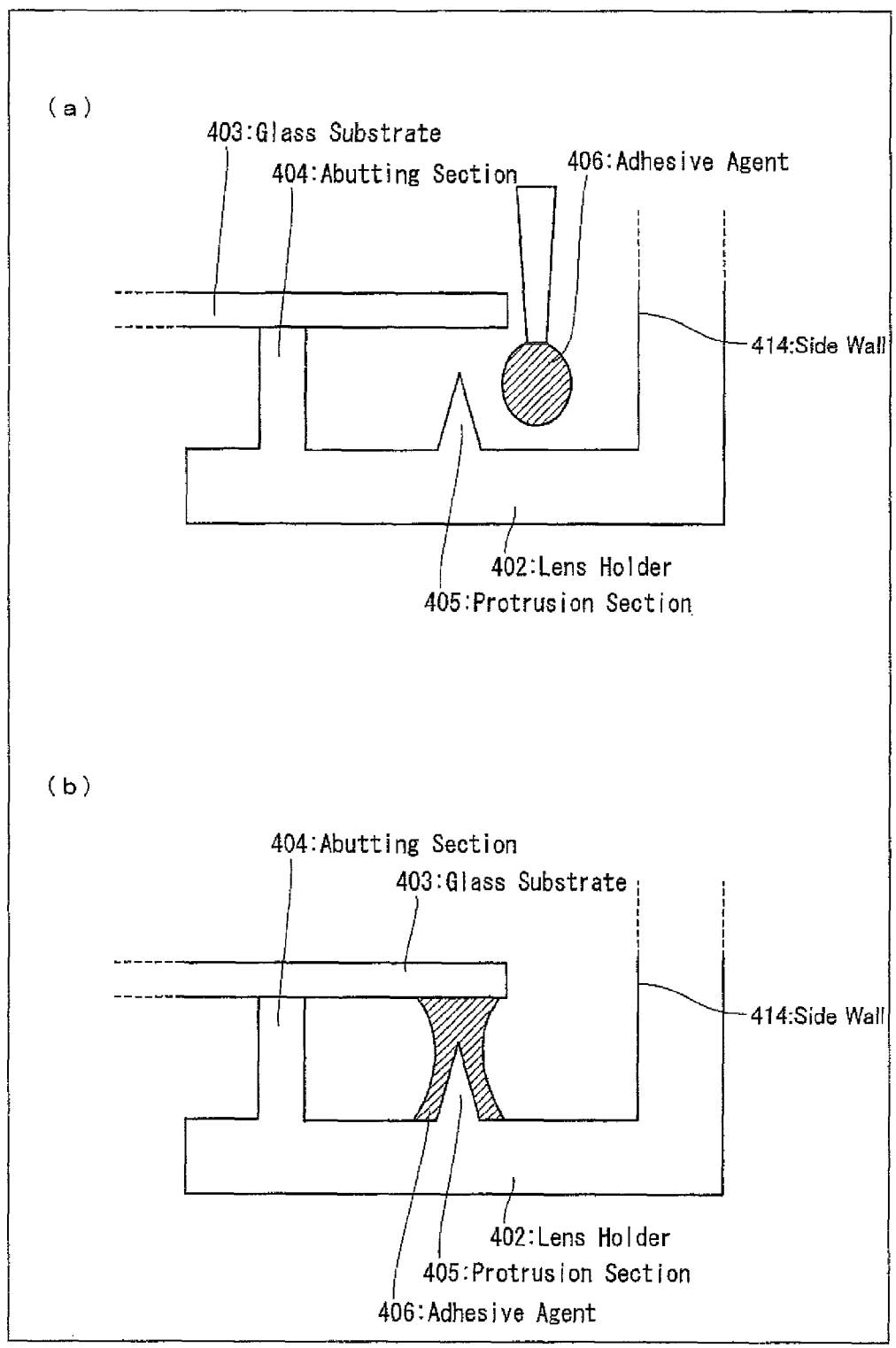

(a) and (b) of FIG. 21 are cross sectional view illustrating how the glass substrate is bonded to the lens holder in still another way.

FIG. 22

Figure 22:
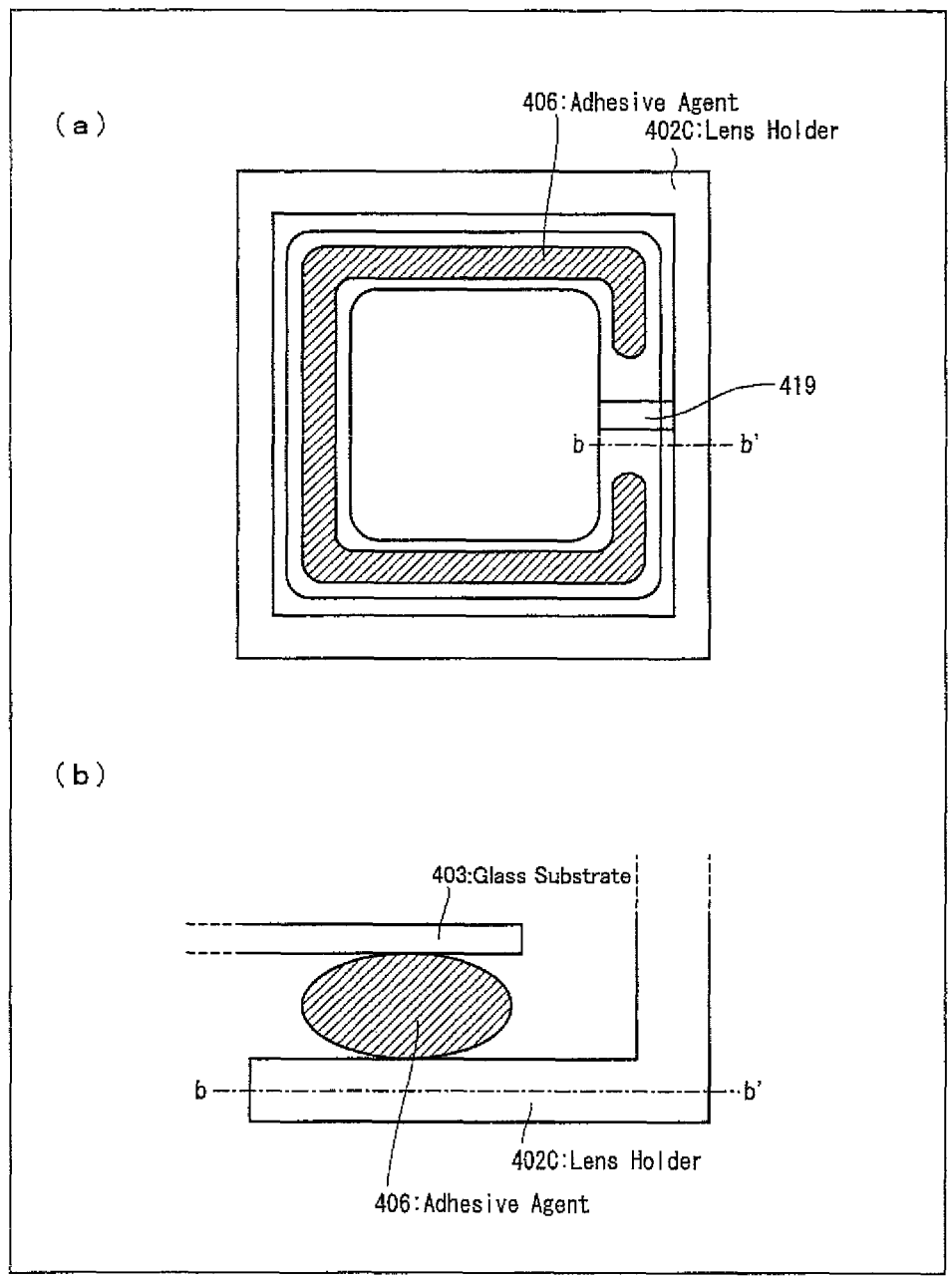

(a) of FIG. 22 is a plan view illustrating how a lens holder and a glass substrate is bonded according to a conventional art having neither an abutting section nor a protrusion section. (b) of FIG. 22 is a cross sectional view taken along b-b' of (a) of FIG. 22.

FIG. 23

Figure 23:
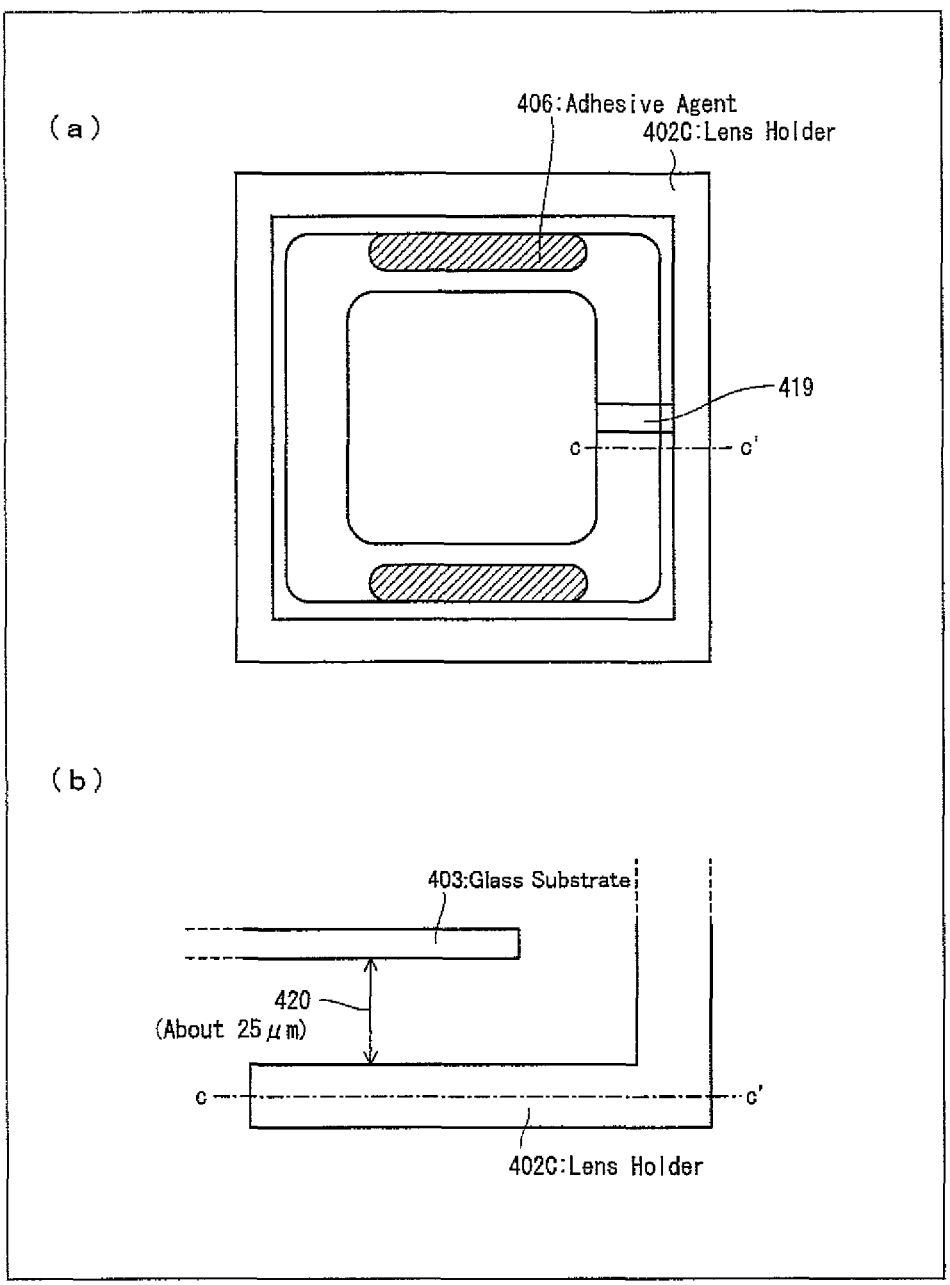

(a) of FIG. 23 is a plan view illustrating how the lens holder and the glass substrate as illustrated in (a) of FIG. 22 is bonded. (b) of FIG. 23 is a cross sectional view taken along c-c' of (a) of FIG. 23.

FIG. 24

Figure 24:
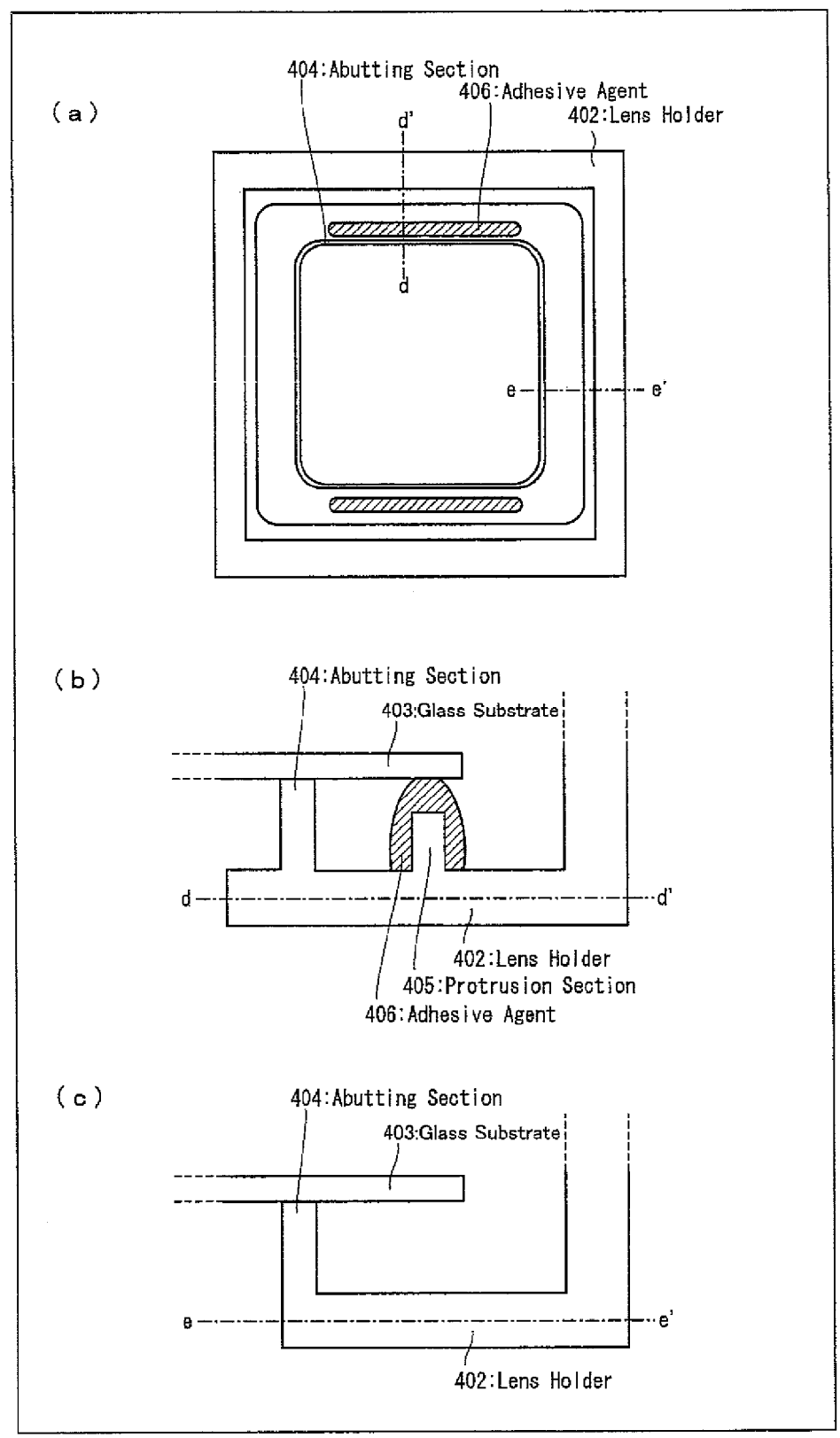

(a) of FIG. 24 is a plan view illustrating how a lens holder and a glass substrate are bonded according to the present invention. (b) of FIG. 24 is a cross sectional view taken along d-d' of (a) of FIG. 24. (c) of FIG. 24 is a cross sectional view taken along e-e' of (a) of FIG. 24.

FIG. 25

Figure 25:
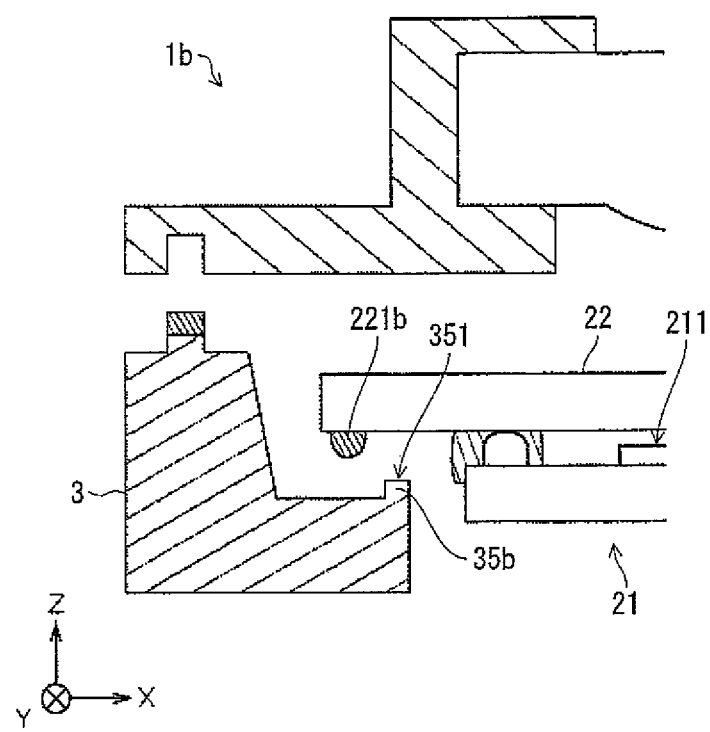

FIG. 25 is a view illustrating a configuration of a camera module according to a conventional art.

FIG. 26

Figure 26:
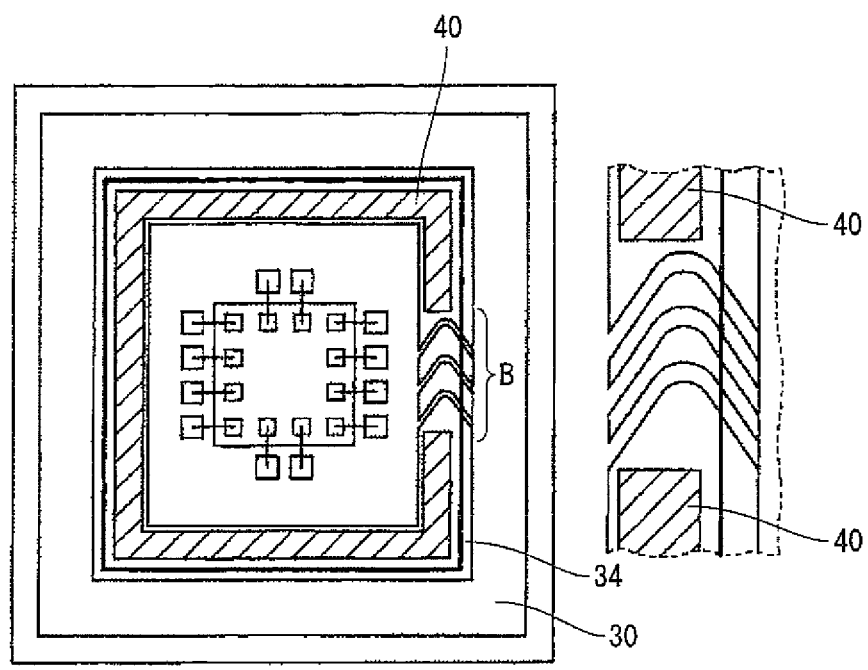

FIG. 26 is a view illustrating a configuration of a camera module according to another conventional art.

DESCRIPTION OF EMBODIMENTS

[Configuration of Camera Module]

Figure 1:
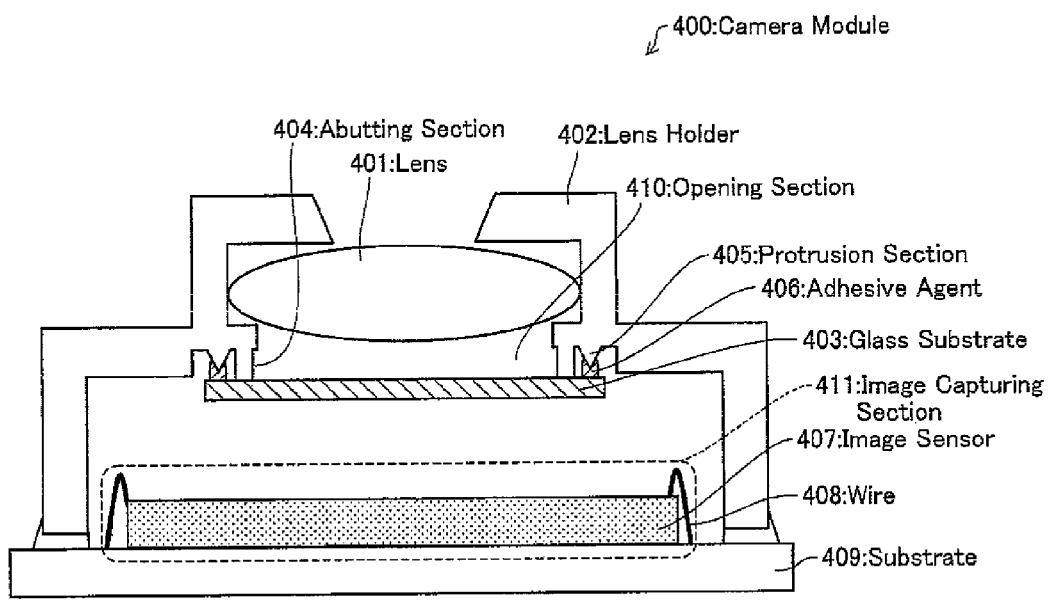
FIG. 1
FIG. 1 is a cross sectional view illustrating a configuration of a camera module according to the present invention.

FIG. 1 is a cross sectional view illustrating a configuration of a camera module according to the present invention.

A camera module 400 illustrated in FIG. 1 includes a lens 401, a lens holder 402, a glass substrate 403, an abutting section 404, a protrusion section 405, an adhesive agent 406, an image sensor 407, a wire 408, and a substrate 409.

The lens 401 is configured to converge light having entered the camera module 400.

The lens holder 402 is a hollowed component made from resin and configured to hold the lens 401.

The lens holder 402 is mounted on a surface of the substrate 409, and has an opening section 410. The opening section 410 is formed between the lens 401 and the glass substrate 403, and opened for allowing light having passed through the lens 401 to enter the glass substrate 403. Moreover, along a direction substantially perpendicular to an optical axis of the lens 401, a hollowed portion of the lens holder 402 has such a cross sectional shape having a larger portion and a smaller portion bordered with the large portion along the opening section 410. The larger portion is located closer to the substrate 409 and the smaller portion is closer to the an object (not illustrated) whose image is to be captured. The lens 401 is held in the smaller portion of the hollowed portion so as to be located between the object and the opening section 410.

For the sake of easy explanation, surfaces of the substrate 409 are referred to as follows: the surface on which the lens holder 402 is mounted is referred to as "a top surface"; the surface on which the lens holder 402 is not mounted and is parallel with the top surface is referred to as "a reverse surface"; and surfaces on which the lens holder 402 is not mounted and is perpendicular with the top surface is referred to as "side surfaces". Moreover, in the following, a surface of the lens holder 402, which surface faces the top surface of the substrate 409 and is opened to form the opening section 410 is referred to as "a ceiling surface" of the lens holder 402.

The glass substrate 403 is a substrate for receiving, via the opening section 410, the light having passed the lens 401, and for allowing the light to pass therethrough.

The glass substrate 403 is bonded to the lens holder 402 in such a way that the glass substrate 403 seals the opening section 410. The glass substrate 403 is a component having optical functions including a function of an optical filter. Furthermore, the glass substrate 403 has a function of preventing dust from contaminating a light receiving portion (micro lens array) of the image sensor 407, wall surfaces (side walls) of the lens holder 402, the top surface of the substrate 409, etc.

The abutting section 404 is a protruded portion for abutting against the glass substrate 403 in order to determine a position of the glass substrate 403 with respect to the ceiling surface of the lens holder 402.

The abutting section 404 is provided on the ceiling surface of the lens holder 402 so as to face a surface of the glass substrate 403. When the glass substrate 403 abuts the abutting section 404, the glass substrate 403 is distanced from the ceiling surface of the lens holder 402 with a distance substantially equal to a height of the abutting section 404.

The abutting section 404 has at least three points being located to be each corner of a triangle and being peaks of an equal height. By this configuration, the abutting section 404 can maintain the glass substrate 403 at an angle substantially horizontal to the ceiling surface of the lens holder 402.

On the other hand, the ceiling surface of the lens holder 402 and the glass substrate 403, which are to face each other at bonding, have not portion (protrusion) protruded beyond the abutting section 404 in height level. That is, the camera module 400 has such a structure that, between the ceiling surface of the lens holder 402 and the glass substrate 403, there is nothing protruded beyond the abutting section 404 in height level in bonding the ceiling surface of the lens holder 402 and the glass substrate 403 with each other. The camera module 400 has a component that should be pressed in bonding the ceiling surface of the lens holder 402 and the glass substrate 403 with each other. Therefore, it is possible to reduce the risk that the glass substrate 403 is insufficiently abutted against the abutting section 404, and the risk that the distance between the ceiling surface of the lens holder 402 and the glass substrate 403, and the tilting angle of the glass substrate 403 are deviated from the desired distance and angle. Similarly, it is possible to reduce the risk that the glass substrate 403 is pressed against the abutting section 404 too strong so that the abutting section 404 is deformed and/or the glass substrate 403 is broken. As a result, the camera module 400 can perform the positioning of the glass substrate 403 highly accurately.

Here, the lens holder 402 and the glass substrate 403 are bonded via the adhesive agent 406. The bonding should not be performed at the abutting section 404. That is, it is necessary that the abutting section 404 should not be bonded to the glass substrate 403. Further, the glass substrate 403 is not fixed to the abutting section 404, and thus can be displaced with respect to the abutting section 404.

The protrusion section 405 is a protruded portion for bonding the lens holder 402 and the glass substrate 403 via the adhesive agent 406.

The protrusion section 405 is provided on the ceiling surface of the lens holder 402, so as to face the surface of the glass substrate 403. Furthermore, the protrusion section 405 is provided to surround the abutting section 404 in a peripheral region of the abutting section 404, but to be positioned apart from the side walls of the lens holder 402. Furthermore, the protrusion section 405 is lower than the abutting section 404. Because the abutting section 404 is provided, the glass substrate 403 and the protrusion section 405 will not touch each other as a result of bonding the lens holder 402 and the glass substrate 403 with each other. That is, a top portion of the protrusion section 405 is positioned apart from the glass substrate 403 so as to have a gap therebetween. The camera module 400 is configured such that the adhesive agent 406 located in the gap between the glass substrate 403 and the protrusion section 405 bonds the lens holder 402 and the glass substrate 403 with each other.

The protrusion section 405 is preferably lower than the abutting section 404 by 25 μm or more. This configuration makes it easier for a filler and a curing agent to pass the gap formed between the glass substrate 403 and the protrusion section 405.

Moreover, along a direction the protrusion section is protruded, the protrusion section 405 has such a cross sectional shape that a width gets smaller from a bottom (root, object side) toward top (peak, substrate 409 side). Hereinafter, this shape is referred to as a "tapered shape". More detailed explanation on functional advantages provided by the tapering of the protrusion section 405 will be provided later.

The adhesive agent 406 is an adhesive agent for bonding the glass substrate 403 and the protrusion section 405 provided on the ceiling surface of the lens holder 402.

The adhesive agent 406 is applied on the protrusion section 405 by a dispenser (see FIGS. 2 to 5) serving as an applying device. As described above, the adhesive agent 406 is not adhered on the abutting section 404.

The image sensor 407 is configured to capture an image by receiving the light having passed through the glass substrate 403, obtaining an optical signal from the light, and converting the optical signal into an electric signal, and may be a solid-state image sensor such as a CCD image sensor or CMOS image sensor.

The image sensor 407 is mounted on the top surface of the substrate 409, and is located inside the hollowed portion of the lens holder 402. The image sensor 407 has the light receiving portion for receiving the light having passed through the glass substrate 403. It is preferable that a micro lens array (not illustrated) is provided in the light receiving portion.

The wire 408 is to configured to electrically connect the image sensor 407 with the substrate 409 by a wire bonding method as well known. The wire 408 is connected to the image sensor 407 and the top surface of the substrate 409.

In FIG. 1, the image sensor 407 and the wire 408 are referred to as an image capturing section 411.

The substrate 409 is a wired substrate on which wiring is provided. The substrate 409 further includes electrodes (not illustrated) on its side surface and reverse surface. The electrodes are for establishing electrical connection with an apparatus (not illustrated) outside of the camera module 400.

In addition to the configuration mentioned above, the camera module 400 may have a plurality of lenses and a mechanism (not illustrated) for moving the plurality of lenses, in order to realize a macro photographic function, zooming function, and/or an auto focus function.

Moreover, the function of the optical filter is not essential to the glass substrate 403.

Moreover, instead of the wire 408, a through electrode may be provided for electrically connecting the image sensor 407 and the substrate 409.

[Problem Associated With Adhesive Application in a Conventional Art]

Figure 2:
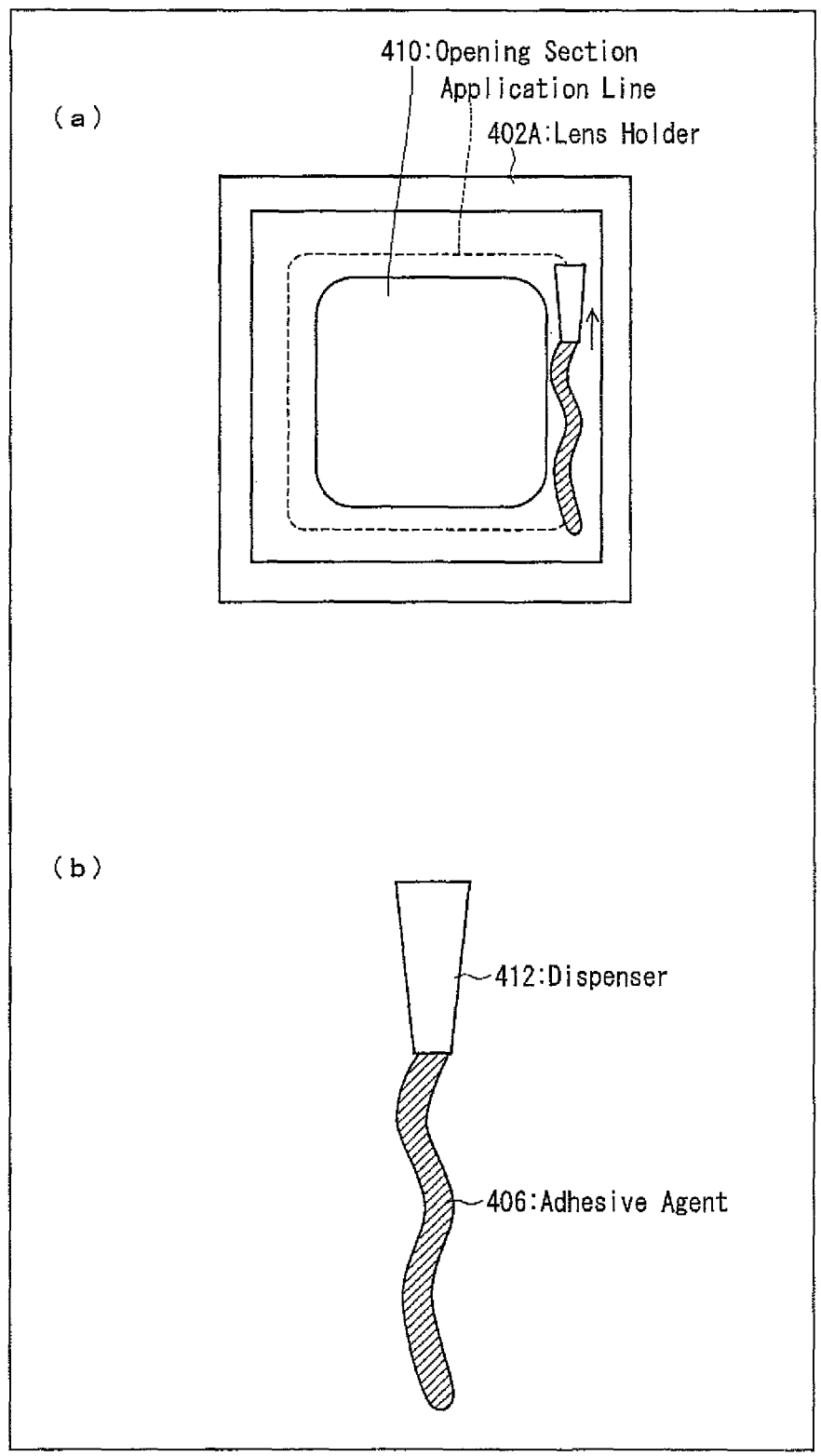
FIG. 2
(a) of FIG. 2 is a plan view of a conventional lens holder viewed from above a side thereof on which a glass substrate is to be mounted. (b) of FIG. 2 is a plan view illustrating only an adhesive agent and a dispenser out of the lens holder illustrated in (a) of FIG. 2.

(a) of FIG. 2 is a plan view of a lens holder 402A according to a conventional art, viewed from above a side thereof on which a glass substrate 403 is to be mounted. (a) of FIG. 2 illustrates a hollowed portion of the lens holder 402A. (b) of FIG. 2 is a plan view illustrating only an adhesive agent 406 and a dispenser 412 out of the lens holder 402A illustrated in (a) of FIG. 2.

It should be noted that the lens holder 402A as illustrated in (a) of FIG. 2 has a structure similar to the lens holder 402, except that the lens holder 402A do not have the abutting section 404 and the protrusion section 405.

When the lens holder 402A of the conventional art is bonded with the glass substrate 403, the adhesive agent 406 is applied on a flat surface section (application line) on a ceiling surface of the lens holder 402A by using the dispenser 412, as illustrated in (a) of FIG. 2.

However, if the adhesive agent 406 is applied in the method as illustrated in (a) of FIG. 2, the adhesive agent 406, the dispenser 412 has a difficulty in dispensing the adhesive agent 406 in a constant direction under influence of various forces applied on the dispenser 412 according to (i) a speed at which the adhesive agent 406 is pushed out from the dispenser 412 and (ii) a moving speed etc. of the dispenser 412. As a result, it is difficult to apply the adhesive agent 406 straightly (in a non-staggered manner), and the adhesive agent 406 is applied in a staggered manner to have a staggered trace (see (b) of FIG. 2). It is necessary to spare a region to allow the adhesive agent 406 to be applied with the staggered trace and a region to allow the adhesive agent 406 to be extended in bonding. This leads to extension of the region (adhesive agent region) the adhesive agent 406 is applied, thereby inhibiting downsizing of the camera module.

[Advantageous Effect of the Adhesive Agent Application For the Camera Module According to the Present Invention]

Figure 3:
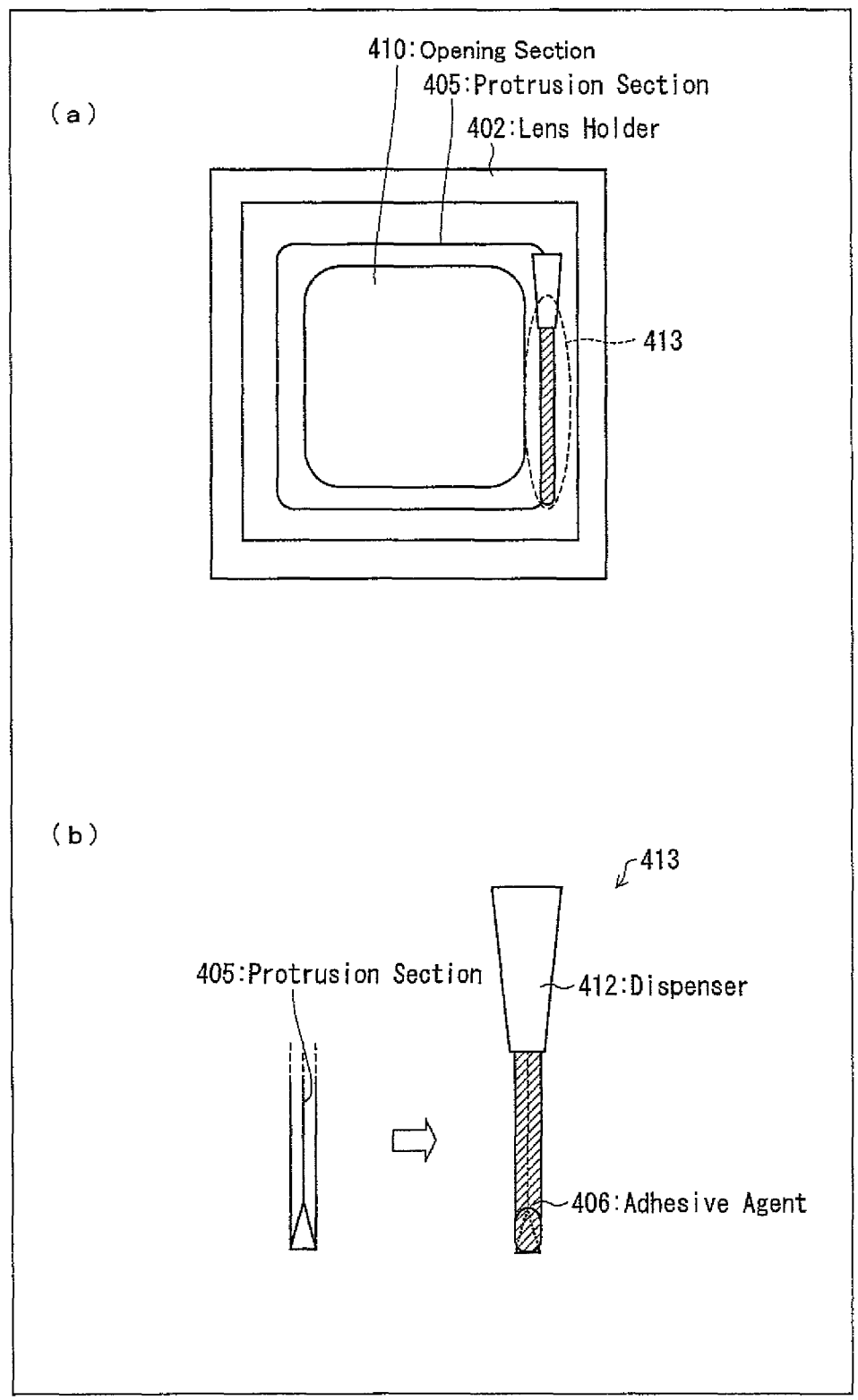
FIG. 3
(a) of FIG. 3 is a plan view illustrating the lens holder illustrated in FIG. 1, viewed from above a side thereof on which a glass substrate is to be mounted. (b) of FIG. 3 is a plan view illustrating only a protrusion section, an adhesive agent, and a dispenser out of the lens holder illustrated in (a) of FIG. 3.

(a) of FIG. 3 is a plan view illustrating the lens holder 402 illustrated in FIG. 1, viewed from above a side thereof on which the glass substrate 403 is to be mounted. (a) of FIG. 3 illustrates the hollowed portion of the lens holder 402. (b) of FIG. 3 is a plan view illustrating only the protrusion section 405, the adhesive agent 406, and the dispenser 412 out of the lens holder 402 illustrated in (a) of FIG. 3. (That is, (b) of FIG. 3 illustrates only the part marked by the oval 413 in (a) of FIG. 3.) For easy explanation and illustration, the lens holder 402 in (a) of FIG. 3 is illustrated without showing the abutting section 404.

Figure 4:
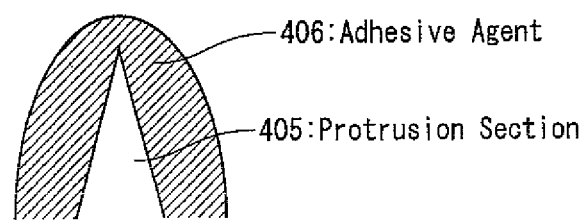
FIG. 4
FIG. 4 is a cross sectional view illustrating one example of a configuration of the protrusion section and the adhesive agent attached thereto.

Moreover, FIG. 4 is a cross sectional view illustrating one example of a configuration of the protrusion section 405 and the adhesive agent 406 attached thereto.

As illustrated in (a) of FIG. 3, the lens holder 402 includes the protrusion section 405. To the top portion of the protrusion section 405, the adhesive agent 406 is applied by means of the dispenser 412. The adhesive agent 406 thus ejected out of the dispenser 412 abuts the top portion of the protrusion section 405, and the adhesive agent 406 as abutted thereto adheres to the top portion of the protrusion section 405. Thus, as illustrated in (b) of FIG. 3, the adhesive agent 406 can be applied in a non-staggered manner as long as the adhesive agent 405 abuts the top portion of the protrusion section 405, even if the dispenser 412 does not dispense the adhesive agent 406 in a constant direction.

As described above, the protrusion section 405 has a guiding function for causing the adhesive agent 406 ejected from the dispenser 412 to be applied on the lens holder 402 in a non-staggered manner. Therefore, the camera module 400 does not need a space for allowing staggering trace of the adhesive agent 406, whereby this allows downsizing of the camera module 400.

Moreover, the bonding region can be reduced as much as possible by providing the abutting section 404 and the protrusion section 405 to be parallel to each other as illustrated in (a) of FIG. 3, for example.

Moreover, it is preferable that the adhesive agent 406 is applied on the protrusion section 405 in such a manner that the top portion of the protrusion section 405 is not exposed. The following explains one example of such a configuration for applying the adhesive agent 406 on the protrusion section 405 in such a manner that the top portion of the protrusion section 405 is not exposed.

Compared with a sharp shaped (pointed shaped) top portion of the protrusion section 405, a slightly shape top portion of the protrusion section 405 gives a greater surface tension to the adhesive agent 406 adhered to the top portion of the protrusion section 405 when the adhesive agent 406 abuts the top portion of the protrusion section 405. Further, by giving the protrusion section 405 a tapered shape, a surface tension can be obtained on a side surface of the protrusion section 405 as well. These surface tension gives the adhesive agent 406 adhering to the protrusion section 405 a waney (curved, or round) dome shape over the protrusion section 405.

With this configuration illustrated in FIG. 4, it becomes possible to retain a greater amount of the adhesive agent 406 near the protrusion section 405. Thus, the extension of the adhesive agent region in which the adhesive agent 406 is applied can be further restricted, thereby allowing further downsizing of the camera module 400.

Moreover, with the configuration illustrated in FIG. 4, which sufficiently restricts the extension of the adhesive agent region, it becomes easy to realize such a configuration as to perform the bonding of the lens holder 402 and the glass substrate 403 with each other without allowing the adhesive agent 406 to adhere to the abutting section. These configurations eliminates the risk of bonding the glass substrate 403 to the abutting section 404. Thus, the glass substrate 403 will not be fixed to the abutting section 404. Moreover, the glass substrate 403 and the protrusion section 405 are not in touch with each other, and the adhesive agent 406 interposes between the glass substrate 403 and the protrusion section 405. Unless the adhesive agent 406 is an adhesive agent having a very large adhesivity (i.e., very small flexibility), it is possible to absorb the stress caused due to the heat expansion of the lens holder 402 and/or the glass substrate 403. This allows the camera module 400 to suppress peeling or cracking of the glass substrate 403.

[Embodiments of Abutting Section and Protrusion Section]

Figure 5:
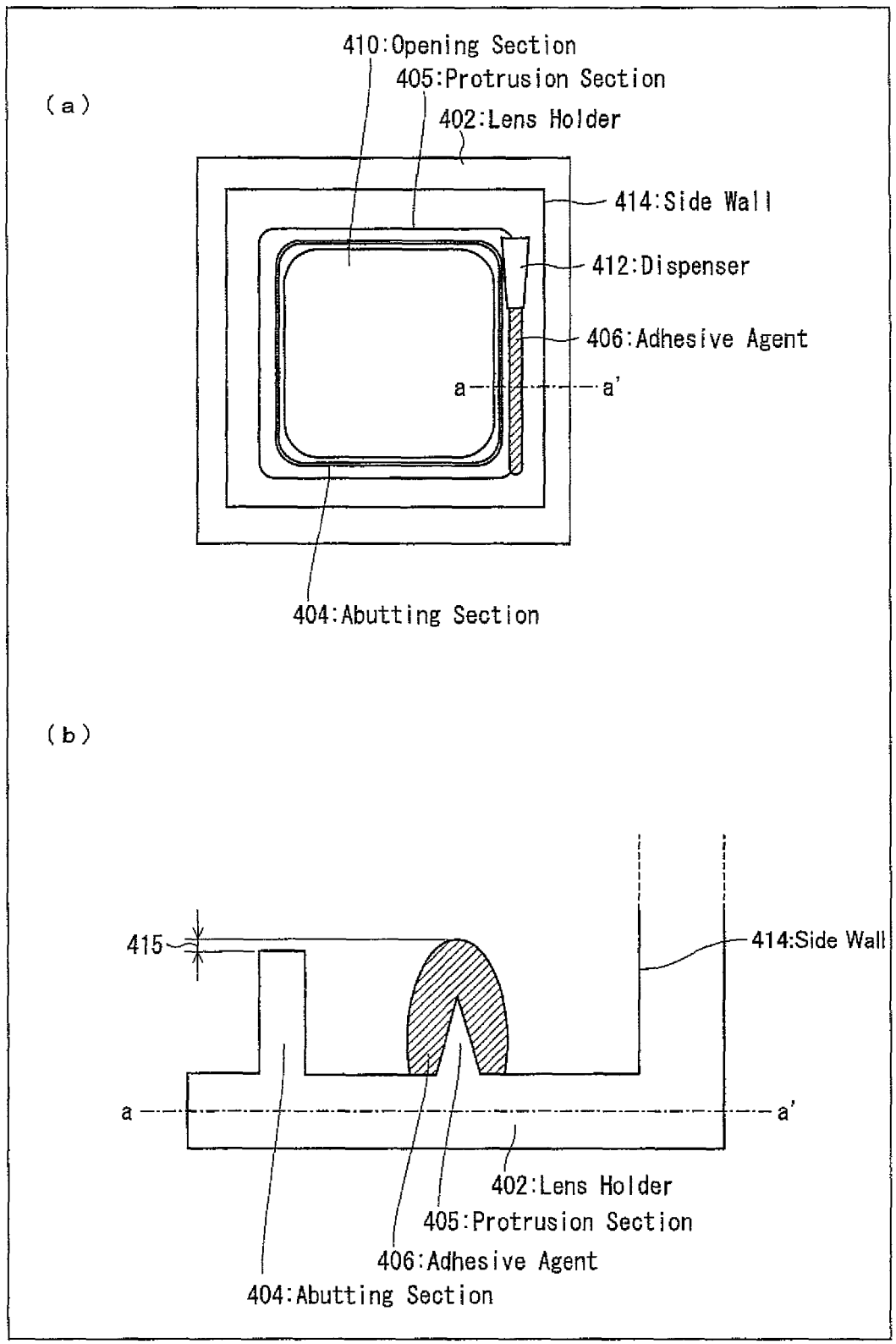
FIG. 5
(a) of FIG. 5 is a plan view illustrating a configuration of an abutting section, a protrusion section, and an adhesive agent according to one embodiment of the present invention. (b) of FIG. 5 is a cross sectional view taken along a-a' in (a) of FIG. 5.

(a) of FIG. 5 is a plan view illustrating a configuration of an abutting section 404, a protrusion section 405, and an adhesive agent 406. (b) of FIG. 5 is a cross sectional view taken along a-a' of (a) of FIG. 5.

As illustrated in (a) of FIG. 5, the abutting section 404 surrounds the opening section 410 and protrudes from a periphery of the opening section 410 in a direction substantially perpendicular to the ceiling surface of the lens holder 402. This makes it easy to completely cover the opening section 410 with the glass substrate 403 abutting the top portion of the abutting section 404 wholly surrounding the opening section 410. By completely covering the opening section 410 with the glass substrate 403, the glass substrate 403 can prevent dust (foreign materials, stains, etc.) from reaching the image capturing section 411 of the camera module 400.

Moreover, the protrusion section 405 is provided around the outer periphery of the abutting section 404 and apart from the side walls of the lens holder 402. The protrusion section 405 surrounds the opening section 410 and the abutting section 404.

As illustrated in (b) of FIG. 5, the protrusion section 405 is lower than the abutting section 404. However, a top portion of the adhesive agent 406 applied on the protrusion section 405 surpasses the top portion of the abutting section 404 (see the reference numeral 415). This is because it is necessary to cause the adhesive agent 406 to touch the glass substrate 403 in order to cause the lens holder 402 and the glass substrate 403 to be bonded with each other. When the top section of the adhesive agent 406 thus applied is higher than that of the abutting section 404, it is possible to cause the adhesive agent 406 to touch with the glass substrate 403 simply by abutting the glass substrate 403 to the abutting section 404.

[Method for Adhering Glass Substrate to Lens Holder]

Figure 6:
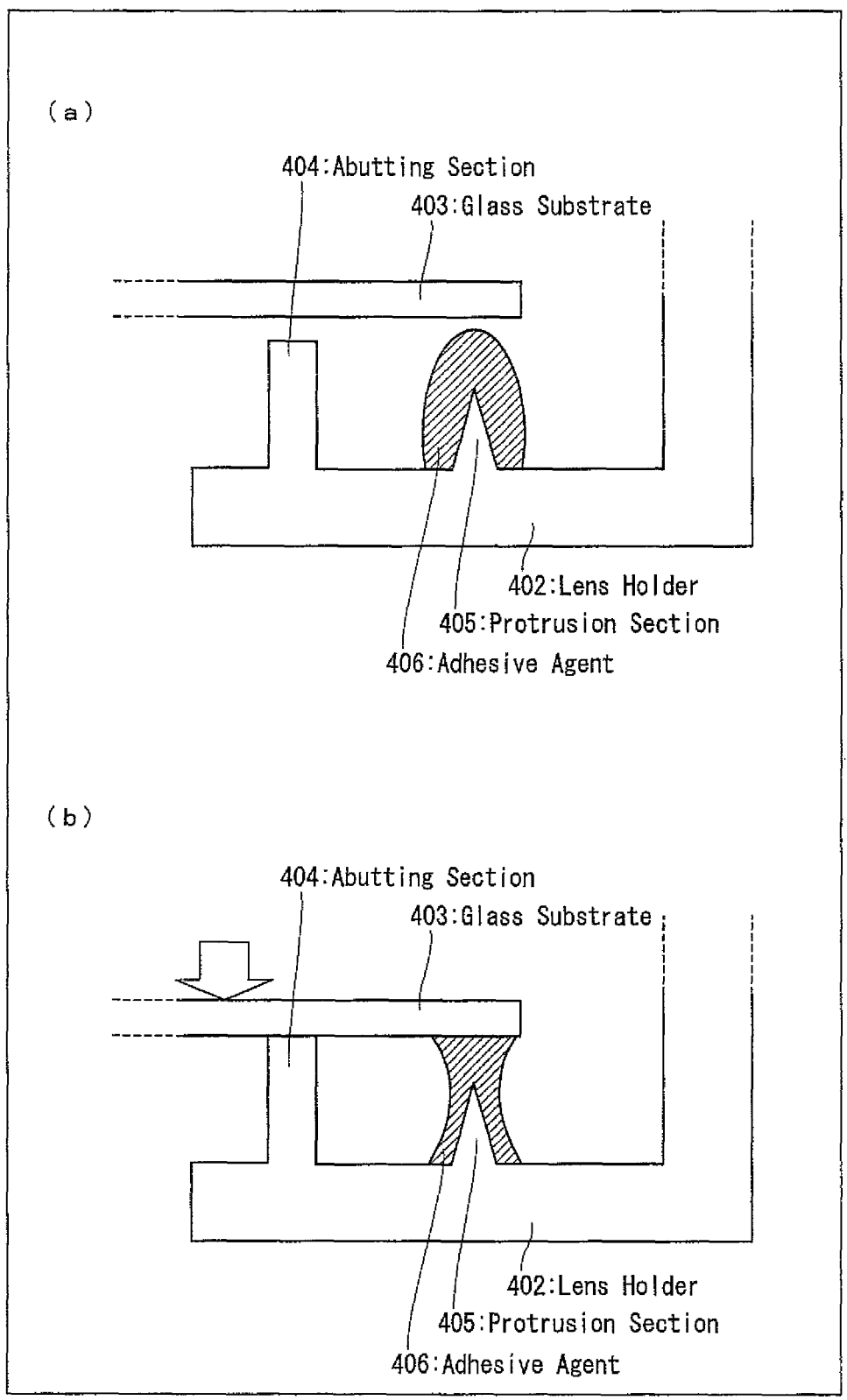
FIG. 6
(a) and (b) of FIG. 6 are cross sectional views illustrating how the glass substrate is bonded to a lens holder.

(a) and (b) of FIG. 6 are cross sectional views illustrating how the glass substrate 403 is bonded to the lens holder 402.

When the adhesive agent 406 is applied to the protrusion section 405, the adhesive agent 406 before abutting the glass substrate 403 against the abutting section 404 is adhered to the protrusion section 405 in such a way that the abutting section 404 has a waney dome-like shape to cover the protrusion section 405 (see (a) of FIG. 6).

After that, when the glass substrate 403 abuts the abutting section 404, so that the glass substrate 403 touches the adhesive agent 406, hydrophilicity of the glass substrate 403 pulls up the adhesive agent 406 to the glass substrate 403, thereby causing the adhesive agent 406 to adhere to the glass substrate 403 (see (b) of FIG. 6). By causing the adhesive agent 406 to adhere to the glass substrate 403, the glass substrate 403 and the protrusion section 405 are bonded together, thereby bonding the lens holder 402 and the glass substrate with each other. The bonding of the lens holder 402 and the glass substrate 403 with each other is completed by curing the adhesive agent 406.

At completing the bonding of the lens holder 402 and the glass substrate 403 with each other by the curing of the adhesive agent 406, the adhesive agent 406 is hardly spread in a direction perpendicular to the protrusion of the protrusion section 405. This behavior of the adhesive agent 406 makes it possible to relatively easily realize a structure in which the adhesive agent 406 will not adhere to the abutting section 404, that is, a structure in which the glass substrate 403 is not bonded to the abutting section 404.

[Embodiment of Region to Which Adhesive Agent is Applied]

Figure 7:
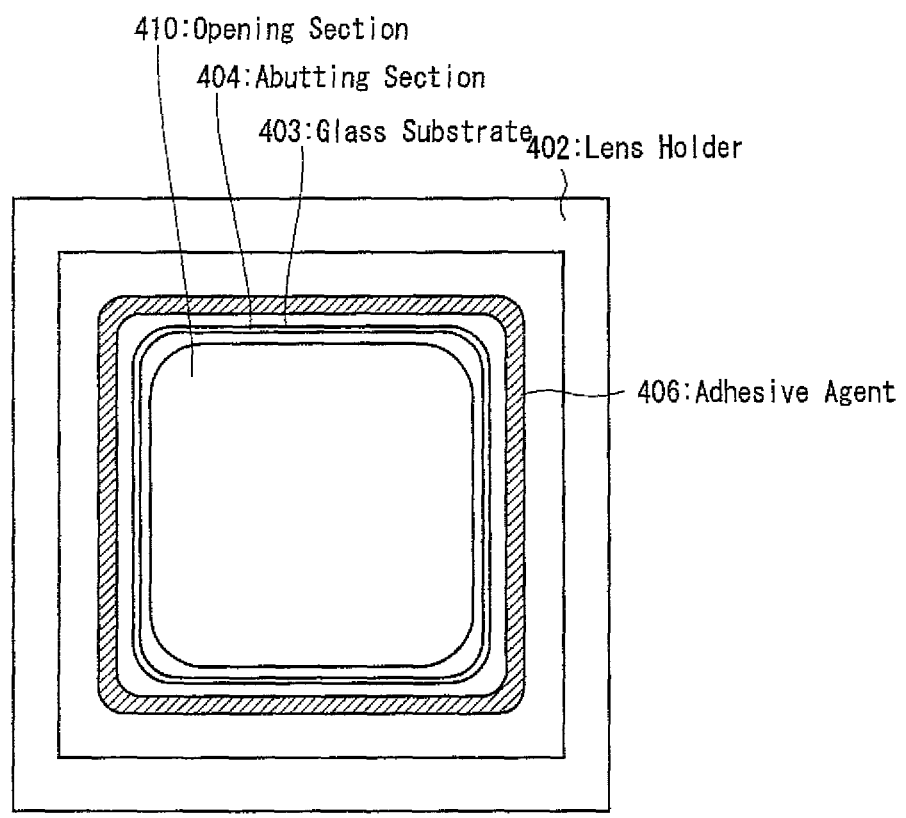
FIG. 7
FIG. 7 is a plan view illustrating one embodiment of a region to which the adhesive agent is applied.

FIG. 7 is a plan view illustrating one embodiment in which the adhesive agent 406 is applied.

Figure 8:
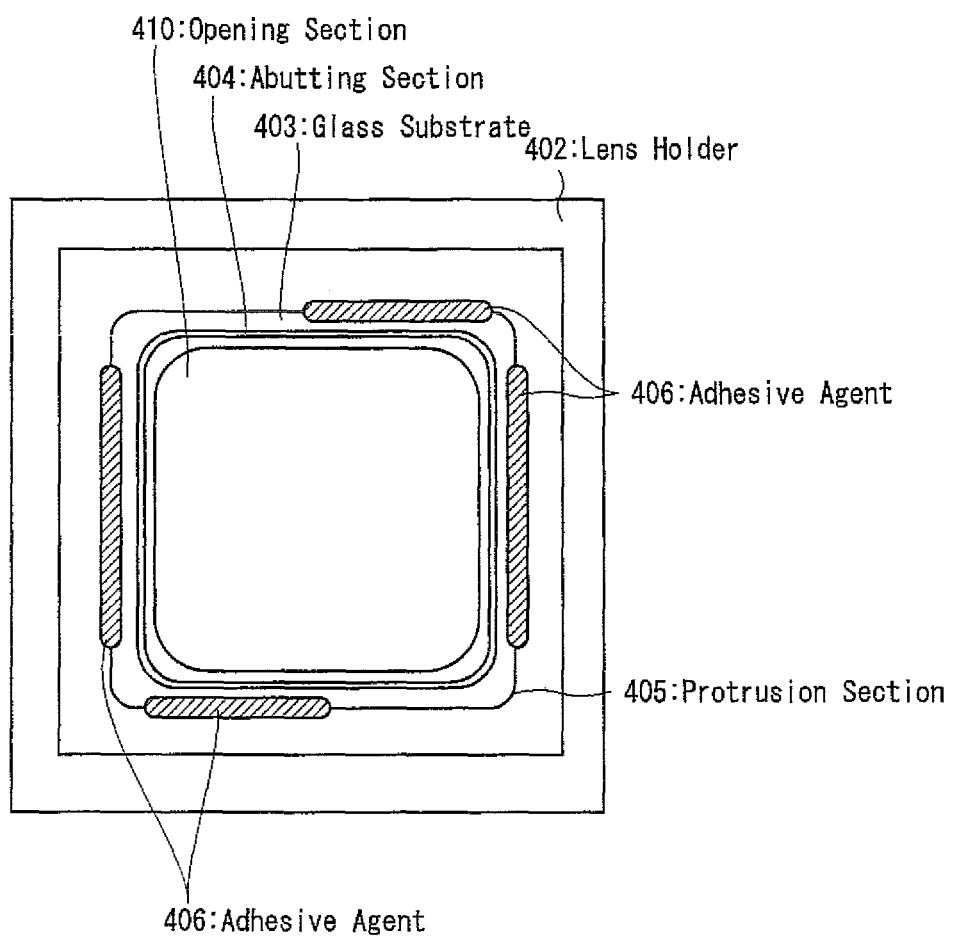
FIG. 8
FIG. 8 is a plan view illustrating another embodiment of the region to which the adhesive agent is applied.

FIG. 8 is a plan view illustrating another embodiment in which the adhesive agent 406 is applied.

Figure 9:
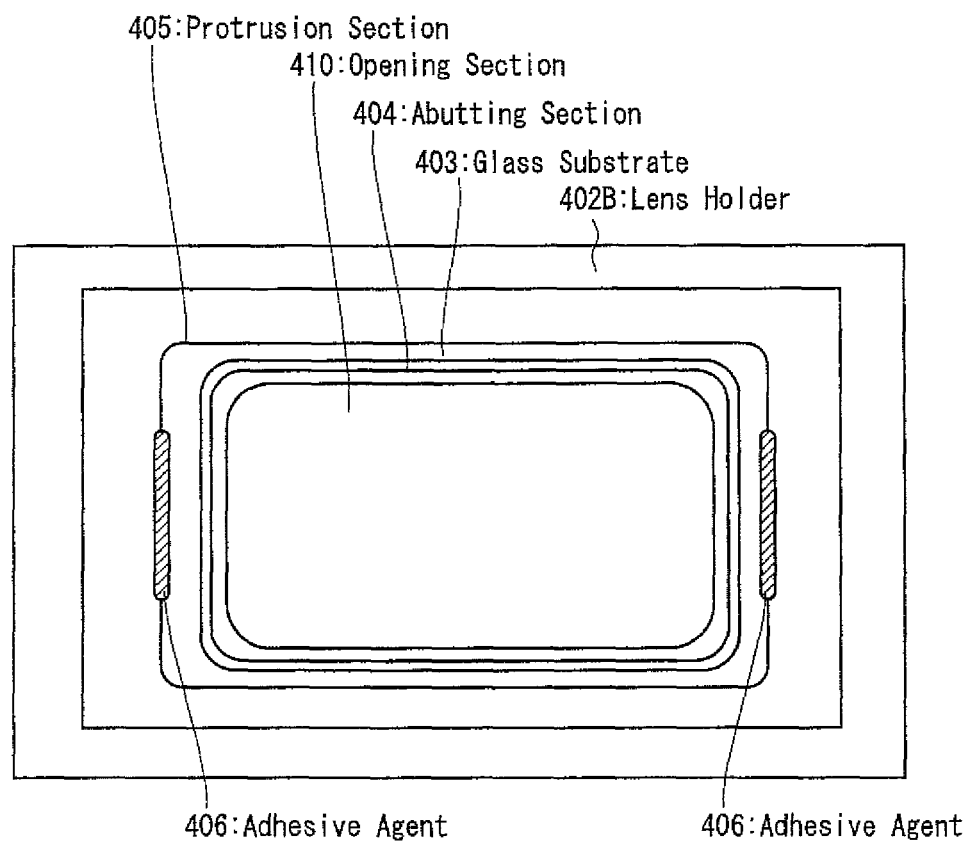
FIG. 9
FIG. 9 is a plan view illustrating still another embodiment of the region to which the adhesive agent is applied.

FIG. 9 is a plan view illustrating still another embodiment in which the adhesive agent 406 is applied.

In the embodiment illustrated is FIG. 7, the adhesive agent 406 is applied on the whole top portion of the protrusion section 405, which top portion is formed to surround the abutting section 404 and the opening section 410.

In the embodiment illustrated in FIG. 8, the adhesive agent 406 is applied on part of the top portion of the protrusion section 405, which top portion is formed to surround the abutting section 404 and the opening section 410.

The present invention is not particularly limited as to whether the adhesive agent 406 is applied on the top portion of the protrusion section wholly or partly. This is a matter that can be decided as appropriate, in consideration of adhesion strength of the adhesive agent 406, and an amount of the adhesive agent 406 to be applied, etc.

The embodiment illustrated in FIG. 9 exemplifies a case of a lens holder 402B similar to the lens holder 402 in structure, except that the lens holder 402B has a rectangular shape in plane view. The lens holder 402B is longer than the lens holder 402 in a horizontal direction of FIG. 9 (longitudinal direction), and shorter than the lens holder 402 in a vertical direction of FIG. 9 (short-side direction). For example, if the camera module has a rectangular shape, the lens holder 402B is adopted.

Here, a protrusion section 405 extended along the longitudinal direction of the lens holder 402B is very close to a side wall of the lens holder 402B along a long side of the lens holder 402B. Thus, it is difficult to apply the adhesive 406 to the protrusion section 405 extended along the longitudinal direction of the lens holder 402B. In this case, it may be arranged such that the adhesive agent 406 is applied on only (two) portions of the top portion of the protrusion section 405, which portions are extended along the short side of the lens holder 402B. The same is applied regardless of whether the lens holder is longer vertically or horizontally.

According to the configurations illustrated in FIGS. 8 and 9, it is possible to reduce the amount of the adhesive agent 406 to be applied. This reduces cost of manufacturing the camera module.

[Absorption of Stress Generated Due to Thermal Expansion]

Figure 10:
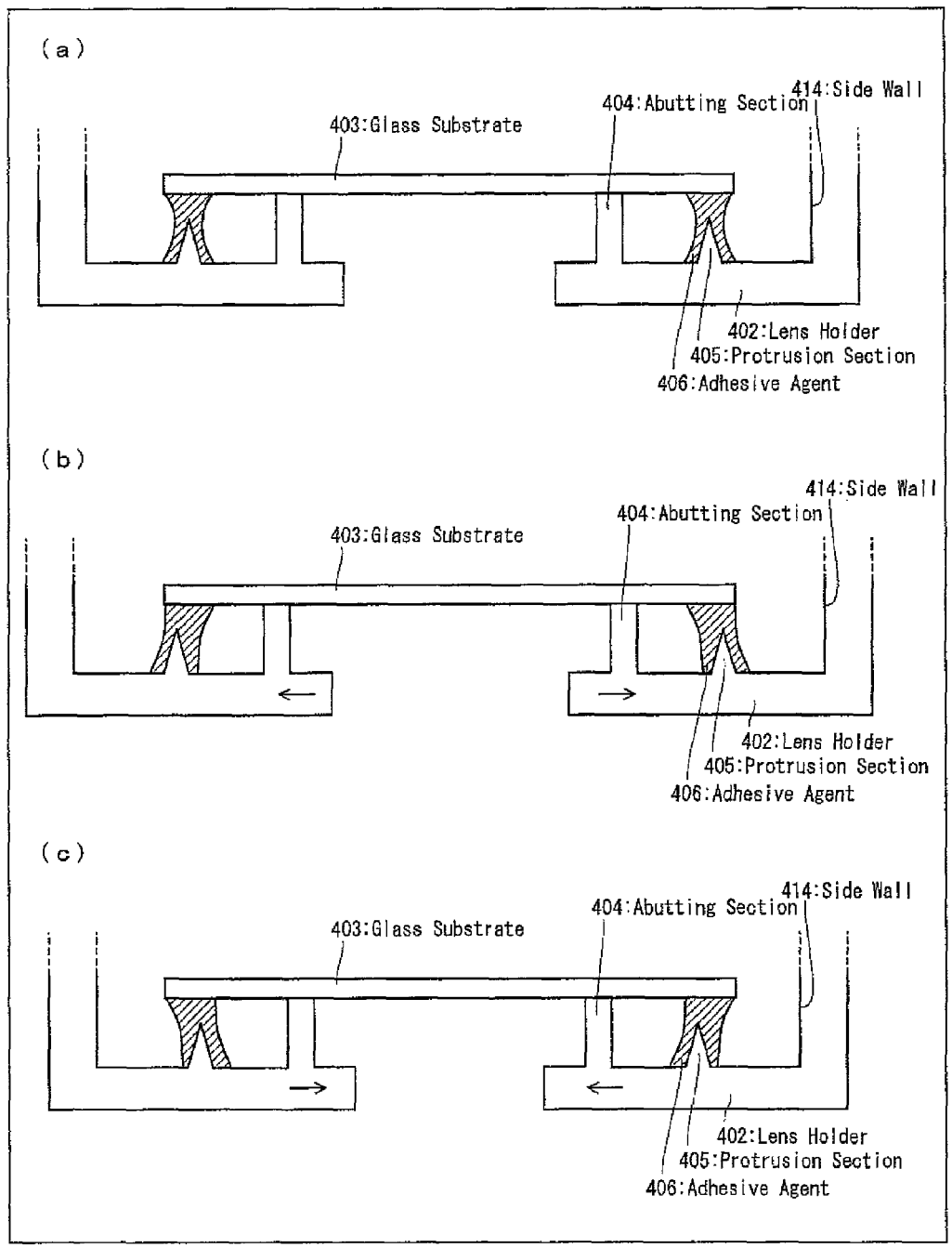
FIG. 10
(a) to (c) of FIG. 10 are cross sectional views illustrating how the lens holder and the glass substrate is bonded via the adhesive agent, and explaining a principle of stress absorption in thermal expansion or thermal shrinkage of the lens holder and the glass substrate.

(a) to (c) of FIG. 10 are cross sectional views illustrating how the lens holder 402 and the glass substrate 403 is bonded via the adhesive agent 406, and explaining a principle of stress absorption in thermal expansion or thermal shrinkage of the lens holder 406 and the glass substrate 403.

In general, when the lens holder 402 made from resin is compared with the glass substrate 403 made from glass, the glass substrate 403 has a smaller thermal expansion coefficient than the lens holder 402.

Thus, for example, in case where the manufacturing process of the camera module has a step of heating the whole camera module 400, the lens holder 402 is thermally expanded more than the glass substrate 403. On the other hand, in case where the manufacturing process of the camera module has a step of cooling the whole camera module 400, the lens holder 402 is thermal shrunk more than the glass substrate 403. The differences in thermal expansion and thermal shrinkage between the lens holder 402 and the glass substrate 403 will be the cause of applying a stress on the glass substrate 403.

In the present invention, the camera module 400 is structured such that the abutting section 404 of the lens holder 402 is not bonded to the glass substrate 403. Moreover, the protrusion section 405 of the lens holder 402 is bonded with the glass substrate 403, but there is a gap between the glass substrate 403 and the protrusion section 405. In the gap, only the adhesive agent 406 is present.

If the adhesive agent 406 is made from a material that is deformable in response to the stress caused due to the thermal expansion or the thermal shrinkage, the camera module 400 can absorb (buffer) the stress with the adhesive agent 406.

(a) of FIG. 10 illustrate a state of the camera module 400, which is neither heated or cooled. For example, the camera module 400 is in such a state at assembling. In the state illustrated in (a) of FIG. 10, no significant thermal expansion nor thermal shrinkage occurs in the lens holder 402 and the glass substrate 403.

(b) of FIG. 10 illustrates a state of the camera module 400, which is heated. In the state illustrated in (b) of FIG. 10, the lens holder 402 is expanded more than the glass substrate 403. However, the stress caused by the expansion is absorbed by deformation of the adhesive agent 406. More specifically, the adhesive agent 406 is deformed in such a way that a glass substrate 403 side of the adhesive agent 406 is tilted toward a center of the ceiling surface of the lens holder 402 (that is, toward the abutting section and 404 and the opening section 410).

(c) of FIG. 10 illustrates a state of the camera module 400, which is cooled. In the state illustrated in (c) of FIG. 10, the lens holder 402 is shrunk more than the glass substrate 403. However, the stress caused by the shrinkage is absorbed by deformation of the adhesive agent 406. More specifically, the adhesive agent 406 is deformed in such a way that a glass substrate 403 side of the adhesive agent 406 is tilted toward an outer periphery side of the ceiling surface of the lens holder 402 (that is, toward the side wall 414 of the lens holder 402).

In this way, the adhesive agent 406 absorbs the stress caused due to the thermal expansion or the thermal shrinkage. This reduces the risk that the peeling or cracking of the glass substrate 403 occurs due to the stress.

Moreover, the same is applied to a camera module provided with the lens holder 402B (that is, a camera module of a horizontally or vertically rectangular shape), even though the above explanation is based on the camera module 400 provided with the lens holder 402, for example.

[Embodiment Provided With Step in Outer Periphery Region of Protrusion Section]

Figure 11:
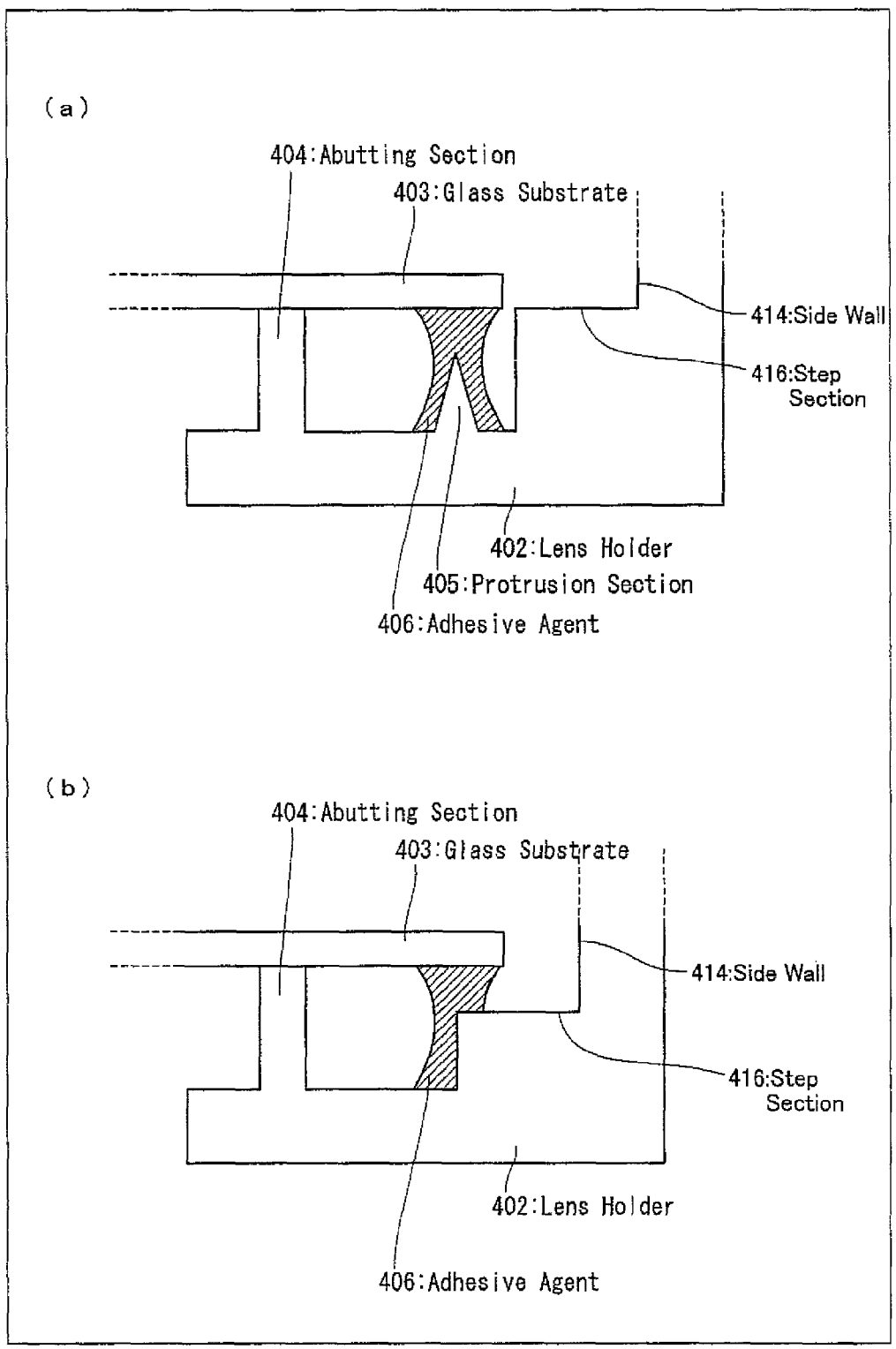
FIG. 11
(a) of FIG. 11 is a cross sectional view illustrating one embodiment in which a step section is provided in an outer peripheral region of the protrusion section. (b) of FIG. 11 is a cross sectional view illustrating another embodiment in which a step section is provided in an outer peripheral region of the protrusion section.

(a) of FIG. 11 is a cross sectional view illustrating one embodiment in which a step section 416 is provided in an outer periphery region of the protrusion section 405.

(b) of FIG. 11 is a cross sectional view illustrating another embodiment in which a step section 416 is provided in the outer periphery region of the protrusion section 405.

The step sections 416 illustrated in (a) and (b) of FIG. 11 surround the opening section 410 as well as the abutting section 404 and the protrusion section 405. The step sections 416 also surround the glass substrate 403.

The step sections 416 has a function of preventing the adhesive agent 406 from flooding out toward the side wall 414 of the lens holder 402 in applying the adhesive agent 406. By this, the adhesive agent 406 thus applied can effectively utilized to the bonding of the lens holder 402 and the glass substrate 403 together, thereby reducing the risk of insufficient bonding.

Moreover, the step sections 416 has a function of reducing the gap between the lens holder 402 and the glass substrate 403. This can reduce the risk that the dust (exfoliation of a filler fall off from the adhesive agent 406 in which the filler is added, or the like exfoliation) reaches the image capturing section 411.

(a) of FIG. 11 illustrates one example in which a step section 416 is provided to the configurations illustrated in FIG. 6 and the like.

Meanwhile, (b) of FIG. 11 illustrates another example similar to the example of (a) of FIG. 11, except that a step section 416 is provided without providing the protrusion section 405, and the step section 416 is bonded to the glass substrate 403 via the adhesive agent 406, unlike the configurations illustrated in FIG. 6 and the like. As such, the step section 416 can replace the protrusion section 405 in order to attain the effect the protrusion section 405 provides.

Note that the step section 416 can provide in a position other than the side wall 414 of the lens holder 402, while (*a*) and (*b*) of FIG. 11 exemplify the cases in which the step section 416 is provided to the side wall 414 of the lens holder 402.

Moreover, the above explanation can be applied regardless of whether the camera module is the camera module 400 provided with the lens holder 402 or the camera module provided with the lens holder 402B (that is, the camera module having a horizontally or vertically rectangular shape).

[Embodiment in Which a Bank is Provided Between Abutting Section and Protrusion Section]

Figure 12:
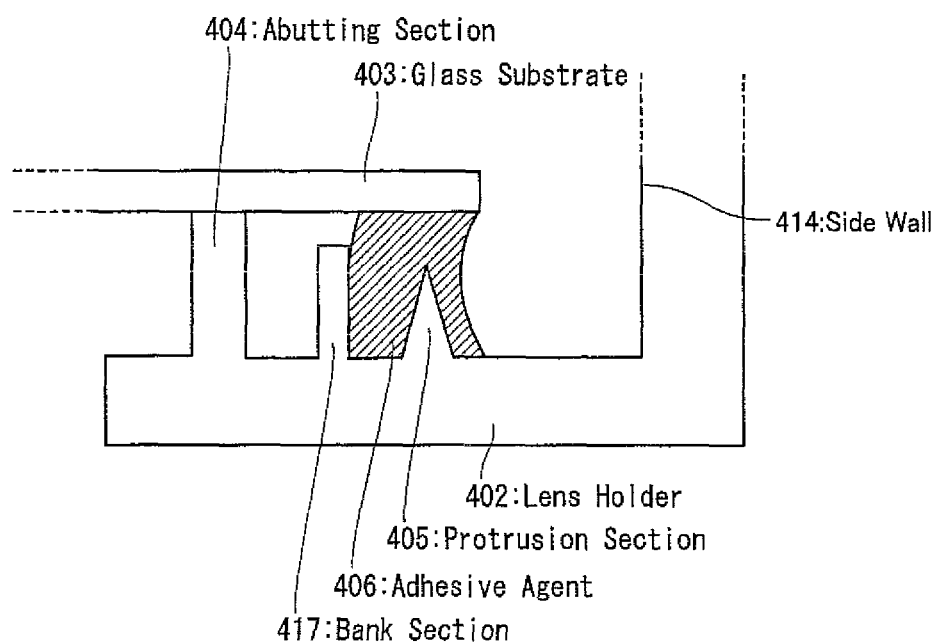
FIG. 12
FIG. 12 is a cross sectional view illustrating one embodiment in which a bank section is provided between the abutting section and the protrusion section.

FIG. 12 is a cross sectional view illustrating one embodiment in which a bank section 417 is provided between the abutting section 404 and the protrusion section 405.

The bank section 417 is a protruded portion provided to the ceiling surface of the lens holder 402, and is located between the abutting section 404 and the protrusion section 405. The bank section 417 is lower than the abutting section 404.

The bank section 417 has a function of preventing the adhesive agent 406 from flooding out from the protrusion section 405 to the abutting section 404 in applying the adhesive agent 406. This causes the adhesive agent 406 thus applied to more effectively contribute to the bonding of the lens holder 402 and the glass substrate 403 together, thereby reducing the risk of insufficient bonding. Moreover, this can further reduce the risk that the adhesive agent 406 adheres to the abutting section 404.

If the glass substrate 403 is bonded with the abutting section 404, the stress absorption capacity in heating or cooling the camera module 400 is significantly reduced. If the adhesive agent 406 floods to reach the opening section 410 over the abutting section 404, the adhesive agent 406 will flow into an optical path of the light to be received by the camera module 400, thereby causing defective image capturing. The configuration with the bank section 417 is effective for preventing such a drawback.

Figure 13:
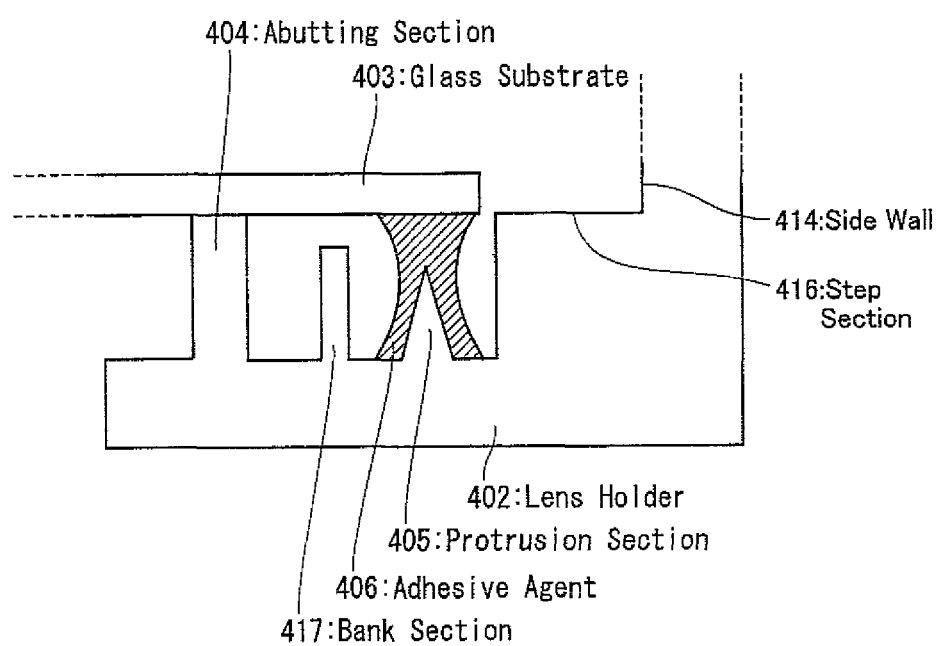
FIG. 13
FIG. 13 is a cross sectional view illustrating one embodiment in which the step section as illustrated in (a) and (b) of FIG. 11, and the bank section as illustrated in FIG. 12 are combined.

The bank section 417 may be used in combination with the step section 416 (see FIG. 13).

Moreover, the above explanation can be applied regardless of whether the camera module is the camera module 400 provided with the lens holder 402 or the camera module provided with the lens holder 402B (that is, the camera module having a horizontally or vertically rectangular shape).

[Shape of Protrusion Section]

(*a*) of FIG. 14 is a cross sectional view illustrating one example of the shape of the protrusion section 405.

(*b*) of FIG. 14 is a cross sectional view illustrating behavior of the adhesive agent 406 in case where the protrusion section 405 has a sharp top portion.

(*c*) of FIG. 14 is a cross sectional view illustrating behavior of the adhesive agent 406 in case where the protrusion section 405 has a flat top portion.

As illustrated in (*a*) of FIG. 14, examples of shapes the protrusion section 405 may have encompass the followings.

A protrusion section 405A' has a shape of an isosceles triangle on a cross section along the direction in which the protrusion section 405A' is protruded. A protrusion section 405B' has a shape of a right-angled triangle on the cross section. A protrusion section 405C' has a shape of a pentagon on the cross section. Protrusion sections 405D' and 405' have shapes of trapezoids on the cross section. A protrusion section 405F' has a shape of a hexagon along on the cross section. A protrusion section 405G' has, on the cross section, a shape of an isosceles triangle, like the protrusion section 405A', but with an acute-angled groove on a top portion thereof. A protrusion section 405H' has, on the cross section, a shape of an trapezoid, like the protrusion section 405D', but with an acute-angled groove on a top portion thereof. A protrusion section 405I' has, on the cross section, a shape of an trapezoid, like the protrusion section 405D', but with a quadrangular-shaped groove on a top portion thereof.

If the protrusion section 405 has a sharp shape, the top portion thereof does not provide surface tension. Thus, as illustrated in (*b*) of FIG. 14, the adhesive agent 406 cannot remain on the top portion, thereby allowing the top portion to be exposed.

Thus, it is preferable that the protrusion section 405 has a waney shaped top portion. With this configuration, the top portion of the protrusion section can also have a surface tension, thereby allowing the adhesive agent 406 to remain on the top portion.

In (*a*) FIG. 14, protrusion section 405A to 405I are illustrated, which are modified correspondingly from the protrusion sections 405A' to 405I' by having waney top portions.

If the protrusion section 405 has a flat top portion as in a protrusion section 405J illustrated in (*a*) of FIG. 14, the adhesive agent 406 thus applied remains on the flat surface of the top portion (see (*c*) of FIG. 14). This provides the same effect as the other protrusion sections 405 with the waney top portions.

If the protrusion section 405 has a flat surface (that is, in the case of the protrusion 405D to 405F, 405H to 405J, the adhesive agent 406 can remain on the flat surface. Thus, even if the adhesive agent 406 is low in viscosity, it is easier to cause the adhesive agent 406 to remain near the protrusion section 405. This widens varieties of options of materials from which the adhesive agent 406 is made.

Moreover, if the protrusion section 405 has a recess on the top portion (that is, in the case of the protrusion sections 405G to 405I), it is possible to cause the adhesive 406 to remain in the recess. Thus, even if the adhesive agent 406 is low in viscosity, it is easier to cause the adhesive agent 406 to remain near the protrusion section 405. This widens varieties of options of materials from which the adhesive agent 406 is made.

Moreover, the above explanation can be applied regardless of whether the camera module is the camera module 400 provided with the lens holder 402 or the camera module provided with the lens holder 402B (that is, the camera module having a horizontally or vertically rectangular shape).

[Embodiment Regarding Region in Which Protrusion Section is Provided]

It is sufficient that the protrusion section 405 is provided in a region in which the adhesive agent 406 is applied. It is not essential that the protrusion section 405 surround the opening section 410 as in the embodiments described so far.

Figure 15:
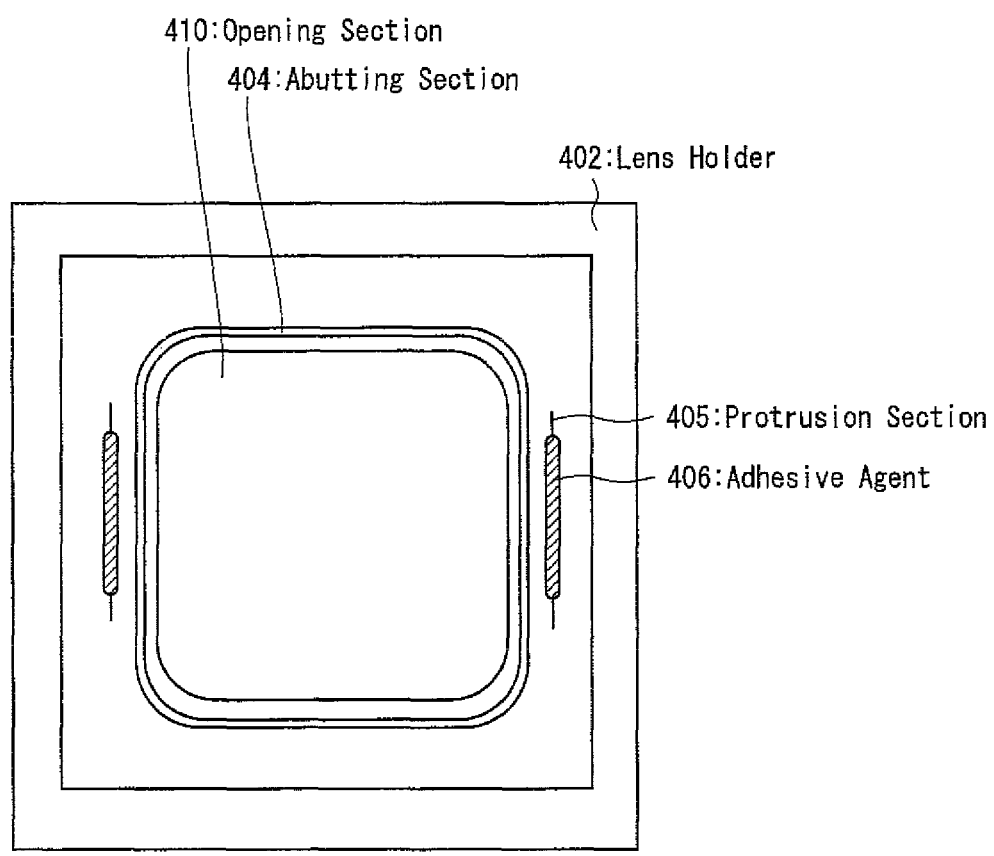
FIG. 15
FIG. 15 is a plan view illustrating another embodiment regarding a region in which the protrusion section is provided.

FIG. 15 is a plan view illustrating another embodiment regarding the region in which the protrusion section 405 is provided.

Figure 16:
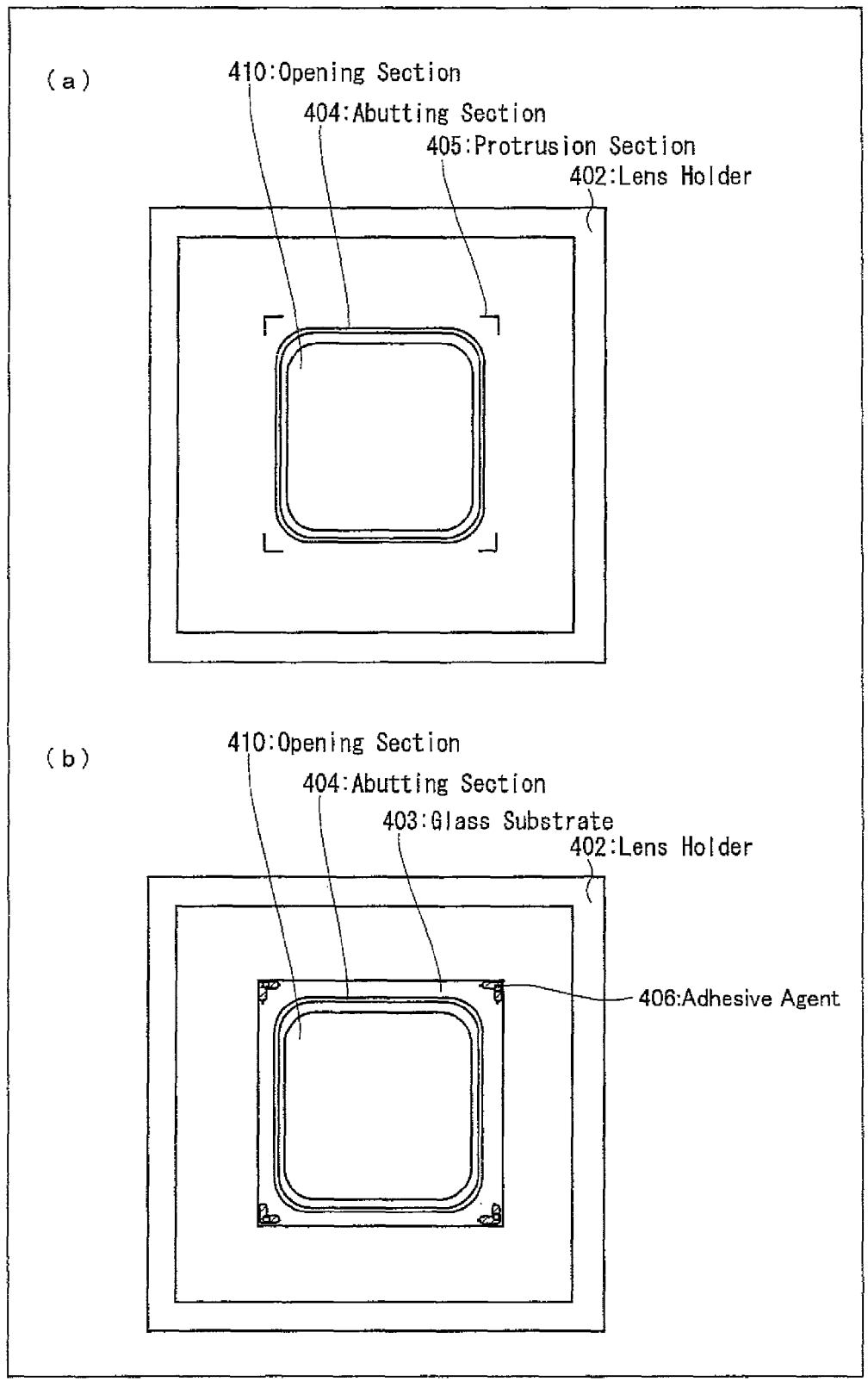
FIG. 16
(a) and (b) of FIG. 16 are plan views illustrating still another embodiments regarding the region in which the protrusion section is provided
FIG. 17
(a) and (b) of FIG. 17 are plan views illustrating still another embodiments regarding the region in which the protrusion section is provided.

(*a*) and (*b*) of FIG. 16 are plan views illustrating still another embodiments regarding the region in which the protrusion section 405 is provided (*a*) and (*b*) of FIG. 17 are plan views illustrating still another embodiments regarding the region in which the protrusion section 405 is provided.

(*a*) and (*b*) of FIG. 18 are plan views illustrating still another embodiments regarding the region in which the protrusion section 405 is provided.

In the embodiment illustrated in FIG. 15, the protrusion section 405 is provided only in two region facing each other across the opening section 410. In other words, in the embodiment illustrated in FIG. 15, the protrusion section 405 is provided to either two facing sides of a substantial square shape surrounding the opening section 410.

In the embodiment of (*a*) of FIG. 16, the protrusion section 405 is provided only to four corners of a substantial square shape surrounding the opening section 410. (*b*) of FIG. 16 illustrates one example in which the glass substrate 403 is mounted on the configuration illustrated in (*a*) of FIG. 16.

In the embodiment illustrated in (*a*) of FIG. 16, L-shaped protrusion sections 405 are provided to the four corners.

In the embodiment illustrated in (*a*) of FIG. 17, the protrusion section 405 are provided only to four corners of a substantial square shape surrounding the opening section 410. (*b*) of FIG. 17 illustrates one example in which the glass substrate 403 is mounted on the configuration illustrated in (*a*) of FIG. 17.

In the embodiment illustrated in (*a*) of FIG. 17, straight-shaped protrusion sections 405 are provided to the four corners. The straight shape is provided such that extension of the straight shape will not pass over the opening section 410.

In the embodiment illustrated in (*a*) of FIG. 18, the protrusion section 405 is provided only to four corners of a substantial square shape surrounding the opening section 410. (*b*) of FIG. 18 illustrates one example in which the glass substrate 403 is mounted on the configuration illustrated in (*a*) of FIG. 18.

In the embodiment illustrated in (*a*) of FIG. 18, cross-shaped protrusion sections 405 are provided to the four corners. The cross shape is provided such that extension of the straight line consisting of the cross shape will not pass over the opening section 410.

According to these configurations, it is possible to reduce the amount of the adhesive agent 406 to apply. Thus, it is possible to reduce the manufacturing cost of the camera module.

Moreover, according to these configurations, it is possible to simplify a step of providing the protrusion section 405. This can further reduce the manufacturing cost of the camera module.

Even though these configurations discuss, examples in which the lens holder has a square shape in plane view (that is, similar to the lens holder 402), the same explanation can be applied to a lens holder having a rectangular shape in plane view (that is, similar to the lens holder 402B) regardless of whether the rectangular shape is longer horizontally or vertically.

[Embodiment Provided With an Air Release in Abutting Section]

Figure 19:
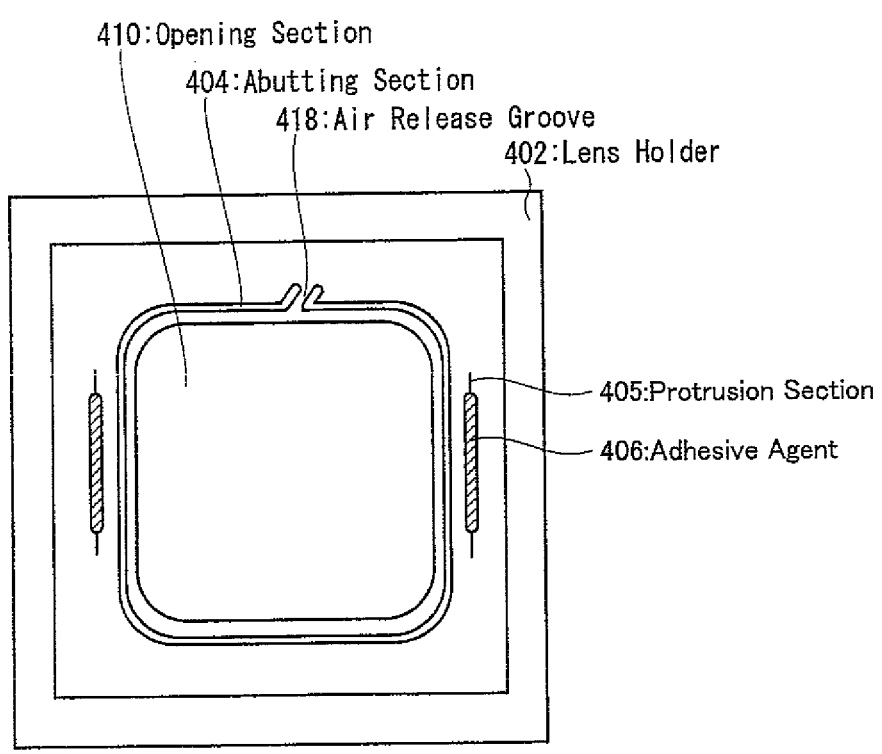
FIG. 19

FIG. 19 is a plan view illustrating one embodiment in which the abutting section 404 has an air releasing groove 418.

The air release groove 418 is provided across the abutting section 404 and is opened toward the side wall 414 of the lens holder 402. The air release groove 418 preferably has a width as large as a diameter of the filler contained in the adhesive agent 406, that is, in the order of 20 μm to 30 μm.

The air release groove 418 is configured to discharge, out of the camera module 400, air expanded in the image capturing section 411 in heating the camera module 400.

By providing the air release groove 418 for discharging the expanded air, the camera module 400 can protect the glass substrate 403 from being damaged by pressure applied thereto from the expanded air.

The presence of the air release groove 418 would increase the risk that dust enter inside the abutting section 404 via the air release groove 418. However, if the protrusion section 405 is provided to surround the opening section 410, it is possible to prevent the dust from reaching the image capturing section 411 even if the air release groove 418 is provided.

Moreover, the above explanation can be applied regardless of whether the camera module is the camera module 400 provided with the lens holder 402 or the camera module provided with the lens holder 402B (that is, the camera module having a horizontally or vertically rectangular shape).

[Method for Adhering Glass Substrate to Lens Holder]

A method for bonding the glass substrate 403 to the lens holder 402, as one production method according to the present invention for producing the camera module.

(*a*) and (*b*) of FIG. 20 are cross sectional view illustrating how the glass substrate 403 is bonded to the lens holder 402 in another way.

(*a*) and (*b*) of FIG. 21 are cross sectional view illustrating how the glass substrate 403 is bonded to the lens holder 402 in still another way.

(*a*) and (*b*) of FIG. 20 illustrates how to apply the adhesive agent 406 to the glass substrate 403 (see (*a*) of FIG. 20), and abutting the glass substrate 403 to the abutting section 404, thereby causing the adhesive agent 406 to touch the protrusion section 405 (see (*b*) of FIG. 20), so as to bond the glass substrate 403 with the protrusion section 405. In order to surely cause the protrusion section 405 and the adhesive section 406 to touch each other, the adhesive agent 406 applied on the glass substrate 403 has a height greater than the level difference between the abutting section 404 and the protrusion section 405.

Moreover, (*a*) and (*b*) of FIG. 21 illustrates how to apply the adhesive agent 406 to the glass substrate 403 and the protrusion section 405 via the gap (see (*b*) of FIG. 21) between the glass substrate 403 and the protrusion section 405 abutted against each other (see (*a*) of FIG. 21), so as to bond the glass substrate 403 to the protrusion section 405.

Still another example of bonding the glass substrate 403 to the lens holder 402 is the bonding method illustrated in FIG. 6.

With these methods, it is possible to provide the camera module 400 with a bonding structure in which the lens holder 402 and the glass substrate 403 are bonded together.

Moreover, the above explanation can be applied regardless of whether the camera module is the camera module 400 provided with the lens holder 402 or the camera module provided with the lens holder 402B (that is, the camera module having a horizontally or vertically rectangular shape).

[Appended Matters]

Conventionally, in order to prevent the dust from entering the pixels, it is necessary to surround the opening section 410 with the bonding regions (see (*a*) and (*b*) of FIG. 22) except a region in which an air path 419 (for example, an air release 418) for releasing air.

(*a*) of FIG. 22 is a plan view illustrating how a lens holder 402C and a glass substrate 403 is bonded according to a conventional art having neither an abutting section 404 nor a protrusion section 405. (*b*) of FIG. 22 is a cross sectional view taken along b- b' of (*a*) of FIG. 22.

In case where part of the region surrounding the opening section 410 is not bonded for the sake of downsizing the camera module (in the case of (*a*) of FIG. 23, this part is left and right portions of the region), a duct 420 is formed between the glass substrate 403 lifted up by the applied adhesive agent 406 and the lens holder 403C in the region in which the bonding is not performed. The duct 420 allows the dust to enter the pixels of the image capturing section 411. It is undesirable to form such a duct 420 (see (*a*) and (*b*) of FIG. 23).

(a) of FIG. 23 is a plan view illustrating how the lens holder 402C and the glass substrate 403 as illustrated in (a) of FIG. 22 is bonded. (b) of FIG. 23 is a cross sectional view taken along c-c' of (a) of FIG. 23.

On the other hand, the camera module according to the present invention, at least one of the abutting section 404 and the protrusion section 405 surrounds the opening section 410. With this configuration, it is possible to prevent the dust from entering the pixels of the image capturing section 411 even via the region in which the adhesive agent 406 is not applied (see (a) to (c) of FIG. 24).

(a) of FIG. 24 is a plan view illustrating how the lens holder 402 and the glass substrate 403 are bonded according to the present invention. (b) of FIG. 24 is a cross sectional view taken along d-d' of (a) of FIG. 24. (c) of FIG. 24 is a cross sectional view taken along e-e' of (a) of FIG. 24.

Moreover, the protrusion section 405 functions as a "guide" for applying the adhesive agent 406 to a targeted position, thereby dealing with the conventional risk that the adhesive agent 406 is applied with the staggered trace.

The camera module 400 is a module including the lens holder 402 for holding the lens 401, and the glass substrate 403 being bonded to the lens holder 402. The lens holder 402 includes the abutting section 404 for abutting the glass substrate 403 in order to perform the positioning the glass substrate 403, and the protrusion section 405 configured to be bonded to the glass substrate 403. The abutting section 404 is not bonded to the glass substrate 403, and the protrusion section 405 is lower than the abutting section 404.

With this configuration, the abutting section 404 abuts the glass substrate 403, thereby making possible to determine the position of the glass substrate 403. Therefore, it is possible to perform the positioning of the glass substrate 403 in bonding the glass substrate 403 to the lens holder 402.

With this configuration, it is not necessary to provide the lens holder 402 or the glass substrate 403 with a member higher than the abutting section 404 in order to perform the bonding of the glass substrate 403 to the lens holder 402. That is, the camera module 400 does not need pressing the lens holder 402 or the glass substrate 403 in order to abut the glass substrate 403 to the abutting section 404. Therefore, it is possible to reduce the risk that the distance between the lens holder 402 and the glass substrate 403, and the tilting angle of the glass substrate 403 are deviated from the desired distance or tilting angle. Moreover, it is possible to reduce the factor for causing disconnection in the glass substrate 403.

According to the arrangement, the abutting section 404, which is a portion with which the lens holder 402 abuts the glass substrate 403, is not bonded to the glass substrate 403, meanwhile the protrusion section 405, lower than the abutting section 404, is bonded to the glass substrate 403. This makes it possible that the glass substrate 403 and the protrusion section 405 do not touch each other when the glass substrate 403 abuts the abutting section 404. This allows the adhesive agent 406 to interpose between the glass substrate 403 and the protrusion section 405. Unless the adhesive agent 406 is not an adhesive agent having a very large adhesive strength (very small flexibility), the behavior of the adhesive agent 406 can absorb the stress caused by the thermal expansion/shrinkage of the lens holder 402 and/or the glass substrate 403. Thus, the camera module 400 can reduce the peeling or cracking of the glass substrate 403.

With this configuration, the adhesive agent 406, applied to the top portion of the protrusion section 405 by an applying device such as the dispenser 412 or the like, abuts the top portion of the protrusion section 405, and the adhesive agent 406 as abutted thereto adheres to the top portion of the protrusion section 405. Therefore, the adhesive agent 406 can be applied in a non-staggered manner by abutting the protrusion section 405 at the top portion thereof, even if the adhesive agent 406 is not ejected in a constant direction from the applying device. As described above, the protrusion section 405 has a guiding function for applying the adhesive agent 406 on the lens holder 402 in a non-staggered manner. Thus, the camera module 400 does not need a space for allowing to apply the adhesive agent 406 with the staggered trace. This makes it possible to downsize the camera module 400.

In this Description, what is meant by the term "top portion" is an upper edge portion of a given member, and the upper edge portion may be a point, a line, or a surface.

With this configuration, the camera module 400 is configured such that the glass substrate 403 will not be bonded with the abutting section 404. Thus, the adhesive agent 406 will not flow to the region where the glass substrate 403 abuts the abutting section 404. Therefore, it will not happen that only the main component of the adhesive agent 406 is spread, by wetting, to the region where the glass substrate 403 abuts the abutting section 404. This makes it possible to reduce the risk that a portion at which curing of the adhesive agent 406 is insufficient or the accuracy in the bonding of the lens holder 402 and the glass substrate 403 is reduced.

Furthermore, this configuration, which makes it possible to apply the adhesive agent 406 in a non-staggered manner by the function of the protrusion section 405, allows to reduce the region to which the adhesive agent 406 is applied. This reduces the risk that the adhesive agent 406 flows into the gap between the glass substrate 403 and the side wall 414 of the lens holder 402. This makes it possible to suppress the risk that the bonding between the lens holder 402 and the glass substrate 403 is insufficient.

As one specific embodiment, the camera module of the present invention is preferably configured such that the protrusion section is positioned apart from a side wall of the lens holder and between the abutting section and the side wall of the lens holder.

As one specific embodiment, the camera module of the present invention is preferably configured such that the protrusion section is positioned to face a surface of the glass substrate.

Moreover, the camera module of the present invention is preferably configured such that the protrusion section has a tapered shape whose cross section along a direction in which the protrusion section is protruded has a width that becomes smaller from a bottom of the protrusion section to the top portion.

This configuration allows the protrusion section to work a greater surface tension to the adhesive agent applied on the protrusion section. With this configuration, it becomes possible to retain a greater amount of the adhesive agent near the protrusion section. Thus, the extension of the adhesive agent region in which the adhesive agent is applied can be further restricted, thereby allowing further downsizing of the camera module.

Moreover, the camera module of the present invention is preferably configured such that the top portion of the protrusion section has a shape having a flat surface.

Moreover, the camera module of the present invention is preferably configured such that the top portion of the protrusion section has a waney shape.

Moreover, the camera module of the present invention is preferably configured such that the top portion of the protrusion section has a shape having a flat surface.

Moreover, the camera module of the present invention is preferably configured such that the top portion of the protrusion section has a shape having a recess.

If the top portion of the protrusion section has a sharp shape, the top portion has no surface tension so as to unable to retain the adhesive agent on the top portion, thereby allowing the top portion to be exposed.

Thus, it is more preferable that the top portion of the protrusion section has a waney shape. By this, it is possible to have a surface tension on the top portion of the protrusion section as well, thereby allowing to retain the adhesive agent on the top portion.

If top portion of the protrusion section has a flat surface, the adhesive agent can remain on the flat surface. Thus, even an adhesive agent with low viscosity can be retained near the protrusion section, thereby widening a range of applicable raw materials from which the adhesive agent is made.

If the top portion of the protrusion section has a recess, it is possible to retain the adhesive agent in the recess. Thus, even an adhesive agent with low viscosity can be retained near the protrusion section, thereby widening a range of applicable raw materials from which the adhesive agent is made.

Moreover, the camera module of the present invention is preferably configured such that the lens holder has an opening section between the lens and the glass substrate, the opening section being configured to allowing light having passed through the lens to enter the glass substrate; and at least one of the abutting section and the protrusion section surrounds the opening section.

In this configuration, at least one of the abutting section and the protrusion section surrounds the opening section. With this configuration, it becomes possible to cover opening with the glass substrate completely when the glass substrate is caused to abut the abutting section and to be bonded to the protrusion section. By completely covering the opening section with the glass substrate, it becomes possible to use the glass substrate to prevent dust (foreign materials, stains, etc.) from reaching the image capturing section of the camera module.

Moreover, the camera module of the present invention is preferably configured such that the lens holder has an opening section between the lens and the glass substrate, the opening section being configured to allowing light having passed through the lens to enter the glass substrate; and the protrusion section includes two protrusion sections provided to face each other across the opening section.

With this configuration, the region in which the protrusion section is provided can be reduced, thereby cutting the manufacturing cost of the camera module.

With this configuration, the region in which the protrusion section is provided can be reduced, making it possible to simplify a process of providing the protrusion section, thereby further cutting the manufacturing cost of the camera module.

Moreover, the camera module of the present invention is preferably configured to comprise an image capturing section including at least an image sensor configured to receive light via the glass substrate, the lens holder having an air release groove across the abutting section, the air release groove being configured to release air inside the image capturing section to outside of the camera module.

With this configuration having the air release groove to release expanded air, it is possible to prevent the glass substrate from being damaged by pressure applied on the glass substrate by the expanded air.

Moreover, the camera module of the present invention is preferably configured such that the abutting section and the protrusion sections are shaped to extend straightly and in parallel with each other.

With this configuration, the abutting section and the protrusion section are in parallel with each other, whereby the region for bonding can be reduced as much as possible.

Moreover, the camera module of the present invention is preferably configured such that the lens holder has a bank section between the abutting section and the protrusion section, the bank section being lower than the abutting section.

In this configuration, the bank section has a function of preventing the adhesive agent from flooding to the abutting section from the protrusion section in applying the adhesive agent. With this, it makes it possible to cause the adhesive agent thus applied to efficiently contribute the bonding of the lens holder and the glass substrate together, thereby reducing the risk that the bonding is insufficient. Further, this makes it possible to reduce the risk that the adhesive agent adheres to the abutting section.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention is applicable to camera modules and production methods thereof, the camera modules being configured to capture an image and to be mounted on camera-equipped portable phones, digital still cameras, security cameras, etc.

REFERENCE SIGNS LIST

400: Camera Module
401: Lens
402: Lens Holder
402B: Lens Holder
402C: Lens Holder
403: Glass Substrate
404: Abutting Section
405: Protrusion Section
405A to 405J: Protrusion Section
406: Adhesive Agent
407: Image Sensor
410: Opening Section
411: Image Capturing Section
414: Side Wall
417: Bank Section
418: Air Release Groove

The invention claimed is:

1. A camera module including a lens holder for holding a lens, and a glass substrate bonded to the lens holder, the lens holder including (i) an abutting section for abutting the glass substrate in order to determine a position of the glass substrate, and (ii) a protrusion section configured to be bonded with the glass substrate via an adhesive agent; the abutting section is not bonded with the glass substrate; and the protrusion section has a top portion that is positioned apart from the glass substrate; and wherein the protrusion section is positioned apart from a side wall of the lens holder and between the abutting section and the side wall of the lens holder.

2. The camera module as set forth in claim 1, wherein: the protrusion section is positioned to face a surface of the glass substrate.

3. The camera module as set forth in claim 1, wherein: the top portion of the protrusion section has a shape having a flat surface.

4. The camera module as set forth in claim 1, wherein: the top portion of the protrusion section has a shape having a recess.

5. The camera module as set forth in claim 1, comprising an image capturing section including at least an image sensor configured to receive light via the glass substrate, the lens holder having an air release groove across the abutting section, the air release groove being configured to release air inside the image capturing section to outside of the camera module.

6. The camera module as set forth in claim 1, wherein: the abutting section and the protrusion sections are shaped to extend straightly and in parallel with each other.

7. The camera module as set forth in claim 1, wherein: the lens holder has a bank section between the abutting section and the protrusion section, the bank section being lower than the abutting section.

8. A camera module including a lens holder for holding a lens, and a glass substrate bonded to the lens holder, the lens holder including (i) an abutting section for abutting the glass substrate in order to determine a position of the glass substrate, and (ii) a protrusion section configured to be bonded with the glass substrate via an adhesive agent; the abutting section is not bonded with the glass substrate; and the protrusion section has a top portion that is positioned apart from the glass substrate; and wherein the protrusion section has a tapered shape whose cross section along a direction in which the protrusion section is protruded has a width that becomes smaller from a bottom of the protrusion section to the top portion.

9. The camera module as set forth in claim 8, wherein: the top portion of the protrusion section has a sharp shape.

10. The camera module as set forth in claim 8, wherein: the top portion of the protrusion section has a waney shape.

11. A camera module including a lens holder for holding a lens, and a glass substrate bonded to the lens holder, the lens holder including (i) an abutting section for abutting the glass substrate in order to determine a position of the glass substrate, and (ii) a protrusion section configured to be bonded with the glass substrate via an adhesive agent; the abutting section is not bonded with the glass substrate; and the protrusion section has a top portion that is positioned apart from the glass substrate; and wherein the lens holder has an opening section between the lens and the glass substrate, the opening section being configured to allowing light having passed through the lens to enter the glass substrate; and at least one of the abutting section and the protrusion section surrounds the opening section.

12. A camera module including a lens holder for holding a lens, and a glass substrate bonded to the lens holder, the lens holder including (i) an abutting section for abutting the glass substrate in order to determine a position of the glass substrate, and (ii) a protrusion section configured to be bonded with the glass substrate via an adhesive agent; the abutting section is not bonded with the glass substrate; and the protrusion section has a top portion that is positioned apart from the glass substrate; and wherein the lens holder has an opening section between the lens and the glass substrate, the opening section being configured to allowing light having passed through the lens to enter the glass substrate; and the protrusion section includes two protrusion sections provided to face each other across the opening section.

* * * * *